United States Patent [19]
Miyazaki et al.

[11] Patent Number: 6,048,647
[45] Date of Patent: *Apr. 11, 2000

[54] PHASE SHIFT MASK OF ATTENUATION TYPE AND MANUFACTURING METHOD THEREOF

[75] Inventors: Junji Miyazaki; Akihiro Nakae; Nobuyuki Yoshioka; Hidehiko Kozawa, all of Hyogo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/965,402

[22] Filed: Nov. 7, 1997

Related U.S. Application Data

[63] Continuation of application No. 08/798,007, Feb. 12, 1997, abandoned, which is a continuation of application No. 08/395,004, Feb. 27, 1995, abandoned.

[30] Foreign Application Priority Data

Apr. 5, 1994 [JP] Japan .................................. 6-066934

[51] Int. Cl.⁷ .............................. G03F 1/08; H01L 21/027
[52] U.S. Cl. .............................................. 430/5; 430/320
[58] Field of Search .................................. 430/321, 320, 430/5

[56] References Cited

U.S. PATENT DOCUMENTS

| | | | |
|---|---|---|---|
| 4,890,309 | 12/1989 | Smith et al. | 378/34 |
| 5,170,293 | 12/1992 | Tanimoto | 430/5 |
| 5,275,894 | 1/1994 | Tanabe | 430/5 |
| 5,387,485 | 2/1995 | Sukegawa et al. | 430/5 |
| 5,397,663 | 3/1995 | Uesawa et al. | 430/5 |
| 5,418,092 | 5/1995 | Okamoto | 430/5 |
| 5,426,007 | 6/1995 | Ogoshi | 430/5 |
| 5,429,897 | 7/1995 | Yoshioka et al. | 430/5 |
| 5,434,647 | 7/1995 | Tanabe | 430/5 |
| 5,447,810 | 9/1995 | Chen et al. | 430/5 |
| 5,458,998 | 10/1995 | Takekuma et al. | 430/5 |
| 5,468,577 | 11/1995 | Bae | 430/5 |

FOREIGN PATENT DOCUMENTS

| | | |
|---|---|---|
| 0 571 929 A2 | 12/1993 | European Pat. Off. . |
| 44 04 453 A1 | 8/1994 | Germany . |
| 57-62052 | 4/1982 | Japan . |
| 58-173744 | 10/1983 | Japan . |
| 4-136854 | 5/1992 | Japan . |
| 2 269 915 | 2/1994 | United Kingdom . |

OTHER PUBLICATIONS

"Imaging Characteristics of Multi–Phase–Shifting and Half-tone Phase–Shifting Masks", Terasawa et al., JJAP Series 5 Proc. of 1991 Intern. MicroProcess Conference, pp. 3–9.

Primary Examiner—Martin Angebranndt
Attorney, Agent, or Firm—McDermott, Will & Emery

[57] ABSTRACT

In accordance with a phase shift mask of attenuation type and a manufacturing method thereof, at a prescribed region of a phase shifter portion near and around a light transmitting portion, an auxiliary pattern is provided for controlling an amount of exposure light onto a portion of an exposed material corresponding to this region. Auxiliary pattern enables to cancel light intensity of a side lobe, thereby preventing generation of a region having a high light intensity (a side lobe) at the periphery of the light transmitting portion of the phase shift mask of attenuation type.

1 Claim, 25 Drawing Sheets

DISTRIBUTION OF INTENSITY OF AMPLITUDE

DISTRIBUTION OF INTENSITY OF AMPLITUDE

DISTRIBUTION OF LIGHT INTENSITY

FIG.32(a) PRIOR ART  CROSS SECTION OF PHOTOMASK
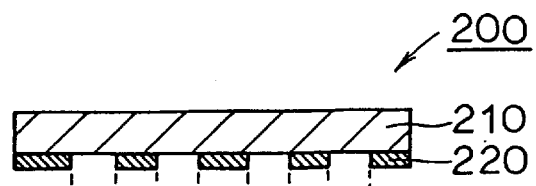
FIG. 32(b) PRIOR ART  AMPLITUDE INTENSITY ON THE PHOTOMASK
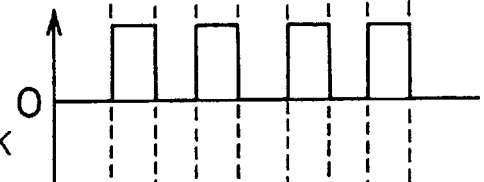
FIG. 32(c) PRIOR ART  LIGHT INTENSITY ON THE WAFER
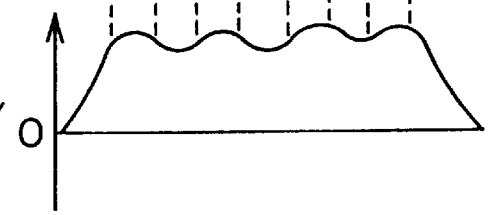
FIG.33(a) PRIOR ART  CROSS SECTION OF PHOTOMASK
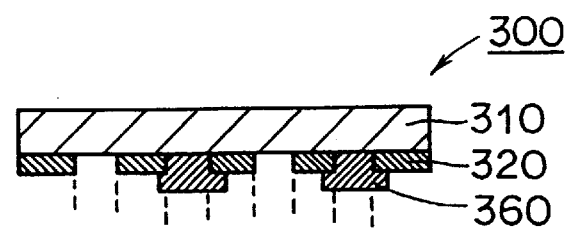
FIG. 33(b) PRIOR ART  AMPLITUDE INTENSITY ON THE PHOTOMASK
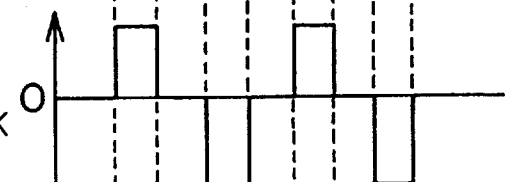
FIG. 33(c) PRIOR ART  LIGHT INTENSITY ON THE WAFER
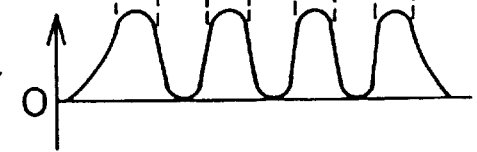

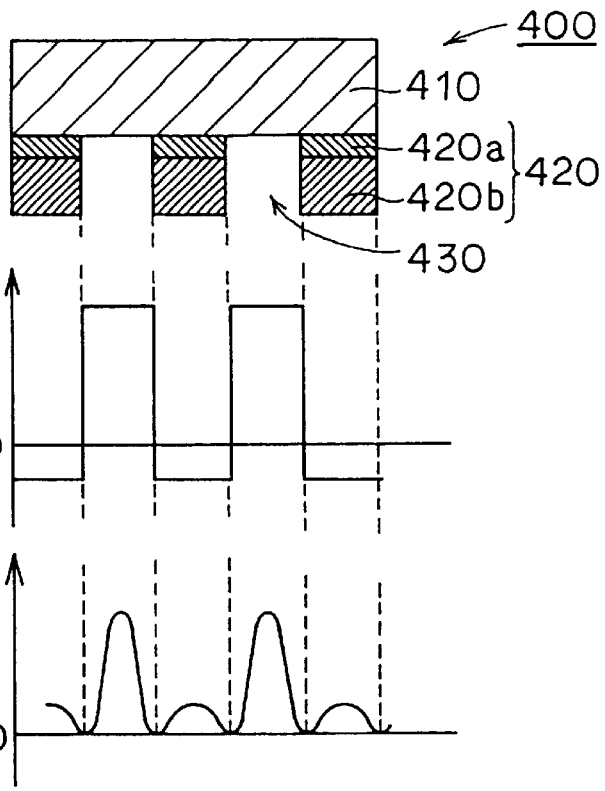
FIG. 34(a) PRIOR ART CROSS SECTION OF PHOTOMASK
FIG. 34(b) PRIOR ART AMPLITUDE INTENSITY ON THE PHOTOMASK
FIG. 34(c) PRIOR ART LIGHT INTENSITY ON THE WAFER
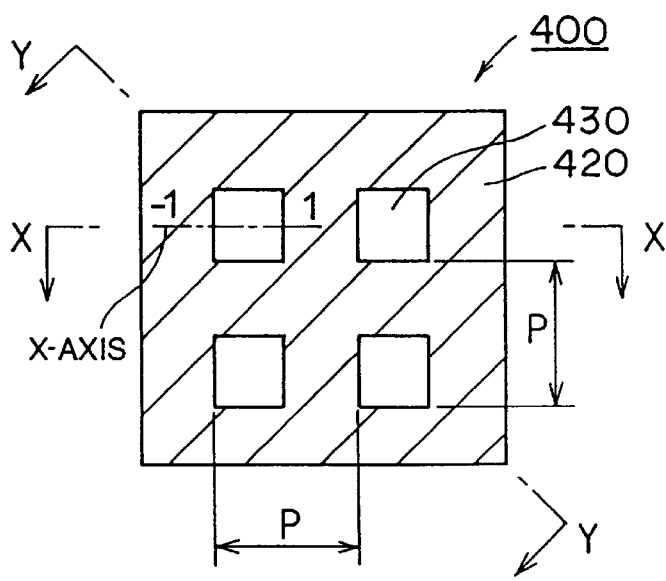
FIG. 35 PRIOR ART

PHASE SHIFT MASK OF ATTENUATION TYPE AND MANUFACTURING METHOD THEREOF

This application is a continuation of application Ser. No. 08/798,007 filed Feb. 12, 1997, which is a continuation of application Ser. No. 08/395,004 filed Feb. 27, 1995 now abandoned.

BACKGROUND OF THE INVENTION

1. Field of the Invention

The present invention relates to a phase shift mask of attenuation type and a manufacturing method thereof, and in particular to a structure of a pattern formed on a phase shift mask of attenuation type.

2. Description of the Background Art

Recently, semiconductor integrated circuits have been highly integrated and miniaturized. Accordingly, minituarization of circuit patterns formed on a semiconductor substrate has been rapidly developed. Photolithography is, among others, a widely-known basic technique for forming a circuit pattern. Although various developments and improvements have been made, a circuit pattern has been miniaturized at even higher rate, resulting in an ever-increasing demand for improvement in resolution of a circuit pattern.

Generally, a resolution limit R (nm) in photolithography using a demagnification exposure method is expressed by:

$$R = K_1 \cdot \lambda / (NA) \quad (1)$$

where $\lambda$ represents a wavelength (nm) of light used, NA represents a numerical aperture of a lens, and $K_1$ represents a constant depending on a resist process.

As can be seen from the equation (1), values of $K_1$ and $\lambda$ should be made smaller and a value of NA should be made larger to improve a resolution limit. In other words, the constant depending on a resist process should be made smaller, with the wavelength being made shorter and NA being increased. It is technically difficult, however, to improve a light source or a lens, and there is such a problem that depth of focus of light $\Delta$ ($\Delta = k_1 \cdot \lambda / (NA)^2$) becomes shallower due to a shorter wavelength and a higher NA, thereby causing a drop in resolution in practice.

Now, with reference to FIG. 32, a cross section of a photomask, intensity of amplitude of exposure light on the photomask, and light intensity of the exposure light on a wafer when conventional photomask is used will be described.

Referring to FIG. 32(a), a cross sectional structure of the photomask is described. A metal mask pattern 220 made of a chromium film or the like is formed on a quartz glass substrate 210. Referring to FIG. 32(b), intensity of amplitude of the exposure light on the photomask corresponds to the photomask pattern. Regarding light intensity of the exposure light on the wafer, however, beams of the exposure light transmitting through the photomask are intensified by each other especially when a fine pattern is to be transferred, due to diffraction and interference at adjacent pattern images where beams of light are overlapped, as shown in FIG. 32(c). Consequently, there is only a small difference in light intensities of the beams on the wafer, resulting in poor resolution.

In order to solve this problem, a phase shifting exposure method using a phase shift mask is proposed, for example, in Japanese Patent Laying-Open Nos. 57-62052 and 58-173744.

Referring to FIG. 33, a phase shifting exposure method using a phase shift mask disclosed in Japanese Patent Laying-Open No. 58-173744 will be described. FIG. 33(a) is a cross sectional view of the phase shift mask. FIG. 33(b) shows intensity of amplitude of exposure light on the phase shift mask. FIG. 33(c) shows light intensity of the exposure light on a wafer.

Referring to FIG. 33(a), a phase shift mask 300 has a phase shifter 360 made of a transparent insulating film such as a silicon oxide film and provided at every other opening of a chromium mask pattern 320 formed on a glass substrate 310.

Referring to FIG. 33(b), amplitude intensities on the photomask of beams of the exposure light passing through phase shift mask 310 are inverted alternately by 180°. As a result, in adjacent pattern images, overlapping beams of the exposure light are canceled with each other due to interference of light. Consequently, referring to FIG. 33(c), there is a sufficient difference in light intensities of beams of the exposure light on the wafer, thereby improving resolution of a pattern image.

However, although the above-described shift mask is very effective for a periodic pattern such as lines and spaces, arrangement of a phase shift mask is extremely difficult for a complex pattern. Therefore, it cannot be used for every type of pattern.

In order to solve the above-mentioned problem, an exposure method using a phase shift mask of attenuation type is disclosed in, for example, JJAP Series 5, Proceedings of 1991 International MicroProcess Conference pp.3–9 and Japanese Patent Laying-Open No. 4-136854. The exposure method using a phase shift mask of attenuation type disclosed in Japanese Patent Laying-Open No. 4-136854 will be described below.

FIG. 34(a) is a cross sectional view of the above-mentioned phase shift mask 400 of attenuation type. FIG. 34(b) shows intensity of amplitude of exposure light on the phase shift mask of attenuation type. FIG. 34(c) shows light intensity of the exposure light on a wafer.

Referring to FIG. 34(a), phase shift mask 400 includes a quartz substrate 410 for transmitting exposure light, a light transmitting portion 430 formed on a main surface of quartz substrate 410 for exposing the main surface of quartz substrate 410, and a phase shifter portion 420 for converting phase of the exposure light passing therethrough by 180° with respect to that of the exposure light passing through light transmitting portion 430.

Phase shifter portion 420 has a two-layered structure consisting of a chromium layer 420a having a transmittance of 5–20% with respect to that of light transmitting portion 430, and a shifter layer 420b converting a phase of the exposure light passing therethrough by 180° with respect to that of the exposure light passing through light transmitting portion 430.

Intensity of amplitude on the photomask of the exposure light passing through phase shift mask 400 having such a structure as described above is shown in FIG. 34(b). Since phase of exposure light is inverted at an edge of an exposure pattern, light intensity on the wafer is always 0 at the edge of the exposure pattern as shown in FIG. 34(c). As a result, sufficient difference is provided between light intensities of the beams of the exposure light passing through a light transmitting portion 430 and phase shifter portion 420 of the exposure pattern, thereby improving resolution of a pattern image.

The above-described phase shift mask of attenuation type, however, has following problems.

FIG. 35 is a plan view of phase shift mask 400 of attenuation type shown in FIG. 34(a). Light transmitting portion 430 is 0.45 μm☐, and a pitch (P) thereof is 0.9 μm.

Light intensity in a direction of X axis of one light transmitting portion 430 will be described with reference to FIG. 36. In FIG. 36, lithography by an exposure apparatus is performed under the following conditions: NA =0.57, σ=0.4, wavelength of exposure light=i-line (365 nm), difference in phase of phase shifter portion 420 =180°. The figure shows examples where transmittance of phase shifter portion 420 is 0%, 5%, 10%, and 15%.

As can be seen from the figure, with the greater transmittance of phase shifter portion 420, width W of a pattern image (PA) is narrower, and a pattern image becomes clearer.

However, as transmittance increases, a portion (A) where light intensity is high (hereinafter referred to as a side lobe) appears adjacent to pattern image (PA). The side lobe (A) is formed by overlapping first-order diffraction light of pattern image (PA) and exposure light passing through phase shifter portion 420 in a region where the first-order diffraction light is located. First-order diffraction light of the pattern image has phase difference of 180° with respect to the exposure light of pattern image (PA).

Next, intensities of light and amplitude of exposure light at a cross section taken along a line Y—Y of phase shift mask 400 of attenuation type shown in FIG. 35 will be described with reference to FIGS. 37–39.

FIG. 37 shows intensity of amplitude only of the exposure light passing through light transmitting portion 430 at Y—Y cross section. In the figure, arrows $A_1$ and $B_1$ show intensities of amplitude of first-order diffraction light. Intensity of amplitude indicated by arrow $B_1$ is greater because it is formed in a region where intensities of amplitude indicated by arrow $A_1$ are overlapped.

FIG. 38 shows intensity of amplitude only of exposure light transmitting through phase shifter portion 420 at Y—Y cross section.

FIG. 39 shows light intensity of the exposure light when intensities of amplitude of the exposure light shown in FIGS. 37 and 38 are combined. As can be seen from the figure, a big side lobe B is formed at an intersection of the extension of diagonal lines of light transmitting portions 430. This is the light intensity at a portion where two side lobes A generated by phase shift mask of attenuation type 400 shown in FIG. 35 are overlapped.

Next, referring to FIGS. 40–42, description will be made to exposure of a resist film using phase shift mask of attenuation type 400 providing such exposure light as mentioned above.

Referring to FIG. 40, a positive resist film 460 is formed on a substrate 450. Positive resist film 460 is exposed to light using phase shift mask of attenuation type 400.

Referring to FIG. 41, positive resist film 460 is developed. At resist film 460, in addition to a pattern 430A corresponding to light transmitting portion 430, a side lobe pattern 430B is formed at a position corresponding to a portion of side lobe B, whereby thickness of resist film 460 is decreased.

Referring to FIG. 42, if substrate 450 is etched by using resist film 460 with the decreased thickness, that portion of substrate 450 is undesirably etched. FIG. 43 is a plan view of the substrate etched in such a manner, where an undesirable pattern 464 which corresponds to the side lobe is present between the originally intended patterns 462.

The above-described problem is experienced when each side of light transmitting portion 430 is 0.45 μm. When light transmitting portion 430 is as small as 0.45 μm☐, beams of first-order diffraction light overlap, causing the above-described problem if many light transmitting portions 430 are arranged. However, if each side of light transmitting portion 430 exceeds 1 μm, even only one light transmitting portion gives rise to the above-mentioned problem.

For example, light intensity of first-order diffraction light is approximately 12% when the pattern size on the mask is 2.0 μm☐, while light intensity of first-order diffraction light reaches as high as 15% when the mask pattern size is as big as 5.0 μm☐. A bigger mask pattern has a greater light intensity of first-order diffraction light. Combined with light intensity of exposure light transmitting through the phase shifter portion, the light intensity increases to approximately 30%, and this alone exposes the resist film.

As an example, a mark for measuring error in alignment (box-in-box type) will be described with reference to FIGS. 45 and 46.

A mark for measuring error in alignment in accordance with a box-in-box type has a square opening portion 505 of 15 μm☐ formed at a first layer 500 and a square pattern 510 of 5 μm☐ formed of a second layer in opening portion 505.

If square pattern 510 is formed at the very center of opening portion 505, then $X_1=X_2$, and $Y_1=Y_2$, and thus there is no deviation between the first and second layers. However, if $X_1 \neq X_2$ and $Y_1 \neq Y_2$, deviations in X and Y directions $\Delta x=(X_1-X_2)/2$, $\Delta y=(Y_1-Y_2)/2$ are measured, and the error in aligning first and second layers is determined.

Referring to FIG. 47, a phase shift mask of attenuation type 600 used for patterning opening portion 505 at first layer 500 has a phase shifter portion 610 and a light transmitting portion 620 on a substrate. Each side of light transmitting portion 620 is approximately 75 μm.

Referring to FIGS. 48–50, intensities of light and amplitude of transmitting exposure light at a cross section taken along a line S—S of phase shift mask of attenuation type 600 will be described below.

Referring to FIG. 48, intensity of amplitude of exposure light transmitting through light transmitting portion 620 is shown. A big image $B_2$ formed by first-order diffraction light is seen at the side of a pattern image $A_2$. FIG. 49 shows intensity of amplitude of exposure light which has past through phase shifter portion 610. Referring to FIGS. 48 and 49, light intensity when beams of exposure light which have passed through light transmitting portion 620 and phase shifter portion 610 are combined is as shown in FIG. 50, where a side lobe $B_3$ having light intensity of approximately 30–40% is undesirably formed at the side of a pattern image $A_3$.

Next, formation of opening portion 505 at first layer 500 by using phase shift mask of attenuation type 600 will be described.

Referring to FIG. 51, first layer 500 is formed on a semiconductor substrate 630 and a resist film 650 is formed on first layer 500. Resist film 650 is exposed to light by using phase shift mask of attenuation type 600.

Referring to FIG. 52, resist film 650 is developed and first layer 500 is patterned by using resist film 650. At this time, however, referring to FIG. 53, an undesirable trench 515 is formed at the side of opening portion 505 due to light intensity of side lobe $B_3$ shown in FIG. 50. Referring to FIG. 54, the undesirable trench 515 is formed almost all around the opening portion 505, resulting in incorrect recognition of an edge of opening portion 505. As a result, measurement of error in alignment cannot be performed correctly.

SUMMARY OF THE INVENTION

One object of the present invention is to provide a phase shift mask of attenuation type and manufacturing method thereof in which the mask has such a pattern that prevents generation of a side lobe which would otherwise be generated at the periphery of a pattern image by exposure light transmitting through the phase shift mask of attenuation type.

The phase shift mask of attenuation type in accordance with the present invention includes a first light transmitting portion formed at a prescribed location on a photomask substrate for controlling transmittance and phase of exposure light passing therethrough, and a second light transmitting portion surrounded by the first light transmitting portion for exposing a surface of the photomask substrate. It also has an auxiliary pattern, formed at a prescribed region of the first light transmitting portion proximate to the second light transmitting portion, for controlling an amount of exposure light onto a region, corresponding to the prescribed region, of a material to be exposed.

The auxiliary pattern is preferably formed at the first light transmitting portion so as to almost surround the second light transmitting portion.

Preferably, the second light transmitting portion has a nearly quadrangle plane, a plurality of the second light transmitting portions are arranged in a matrix on the photomask substrate, and the auxiliary pattern is provided near an intersection point of prolonged diagonal lines of the second light transmitting portions.

The auxiliary pattern preferably includes an auxiliary light transmitting portion having a smaller area for exposing the photomask substrate than that of the second light transmitting portion.

The auxiliary pattern preferably includes a light shielding pattern smaller than the area for exposing the photomask substrate of the second light transmitting portion.

In accordance with the phase shift mask of attenuation type of the present invention, light intensity of a side lobe, generated by combination of light intensity of first-order diffraction light formed by exposure light passing through the second light transmitting portion and light intensity of exposure light passing through the first light transmitting portion, can be canceled by light intensity of exposure light transmitting through the auxiliary pattern. Therefore, undesirable exposure of a resist film due to the light intensity of the side lobe can be prevented, thereby avoiding formation of an unnecessary pattern of a semiconductor device.

Preferably, light intensity of a side lobe generated at the periphery of the second light transmitting portion can also be canceled by light intensity of exposure light passing through the auxiliary pattern.

Preferably, light intensity of a side lobe generated at an intersection point of prolonged diagonal lines of the second light transmitting portions can be canceled by light intensity of exposure light passing through the auxiliary pattern.

The auxiliary pattern can preferably be formed through the same manufacturing process as for the first light transmitting portion, and therefore the same manufacturing process as in the prior art can be utilized.

Preferably, a light shielding pattern is formed beforehand at a region where a side lobe is to be generated, in order to reduce light intensity at this region. As a result, light intensity of a side lobe generated at the periphery of the second light transmitting portion can be reduced, thereby preventing generation of the side lobe.

A method of manufacturing a phase shift mask of attenuation type in accordance with the present invention includes the following steps.

First, a phase shift film of attenuation type is formed on a photomask substrate, for controlling transmittance and phase of exposure light passing therethrough. A resist film for an electron beam is then formed on the phase shift film of attenuation type.

An electron bean is directed to the resist film for an electron beam to draw the following three patterns: a first pattern for forming a first light transmitting portion formed of what is left of the phase shift film of attenuation type, a second pattern for forming a second light transmitting portion exposing the photomask substrate, and a third pattern for forming an auxiliary pattern, formed at a prescribed region of the first light transmitting portion proximate to the second light transmitting portion, for controlling an amount of exposure light onto a region, corresponding to the prescribed region, of a material to be exposed. The resist film for an electron beam is then developed.

The phase shift film of attenuation type is patterned by using as a mask the developed resist film for an electron beam to form the first light transmitting portion made of the phase shift film of attenuation type, the second light transmitting portion exposing the photomask substrate, and the third light transmitting portion.

In the present invention, preferably the step for drawing the second and third patterns includes a step of directing more electron beams to the second pattern than to the third pattern.

Preferably, the step for drawing the third pattern includes a step of directing an electron beam in a larger area than intended to be directed by design.

The auxiliary pattern preferably includes an auxiliary light transmitting portion having a smaller area for exposing the photomask substrate than that of the second light transmitting portion. As a result, the auxiliary pattern can be formed by the same manufacturing process as for the first light transmitting portion, thereby allowing the use of the same manufacturing process as in the prior art.

The auxiliary pattern preferably includes a light shielding pattern having a smaller area for exposing the photomask substrate than that of the second light transmitting portion. As a result, the light shielding pattern is formed beforehand at a region where a side lobe is to be generated, in order to reduce light intensity at this region. Consequently, light intensity of a side lobe generated at the periphery of the first light transmitting portion can be reduced, thereby preventing generation of the side lobe.

In accordance with the manufacturing method of a phase shift mask of attenuation type of the present invention, light intensity of a side lobe, generated by combination of light intensity of first-order diffraction light formed by exposure light passing through the second light transmitting portion and light intensity of exposure light passing through the first light transmitting portion, can be canceled by light intensity of exposure light passing through the auxiliary pattern. Therefore, exposure of a resist film by light intensity of a side lobe can be prevented, thereby avoiding formation of an unnecessary pattern of a semiconductor device.

Preferably, with the same process for drawing a pattern, two types of openings having different sizes can be easily formed. Therefore, the second and third patterns can be formed without any additional manufacturing processes.

Preferably, reduction in size of the third pattern can be prevented, which reduction would be caused by lack of drawing due to proximity effect generated at the periphery region of the third pattern in directing electron beams, so that the third pattern can be formed as designed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 32 shows a conventional photomask in which (a) is a cross sectional view showing the structure of a conventional photomask, (b) shows intensity of amplitude of exposure light on the photomask, and (c) shows intensity of exposure light on a wafer.

FIG. 33 shows a conventional phase shift mask in which (a) is a cross sectional view showing the structure of a conventional phase shift mask, (b) shows intensity of amplitude on the phase shift mask, and (c) shows intensity of exposure light on a wafer.

FIG. 34 shows a conventional phase shift mask of attenuation type in which (a) is a cross sectional view showing a structure of the conventional phase shift mask of attenuation type, (b) shows intensity of amplitude of exposure light on the conventional phase shift mask of attenuation type, and (c) shows light intensity of exposure light on a wafer.

FIG. 35 is a plan view showing the conventional phase shift mask of attenuation type shown in FIG. 34(a).

DESCRIPTION OF THE PREFERRED EMBODIMENTS

Now, a phase shift mask of attenuation type in accordance with the present invention will be described with reference to the drawings.

Figure 1:
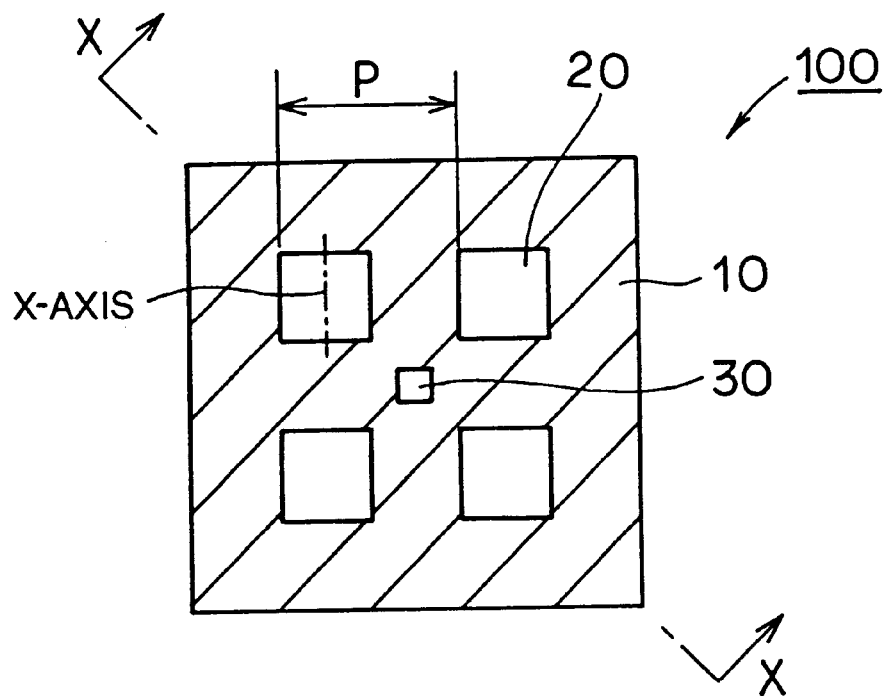
FIG. 1 is a plan view of a phase shift mask of attenuation type in accordance with a first embodiment of the present invention.
Figure 2:
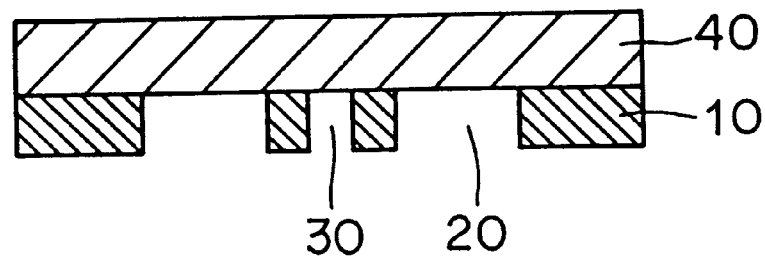
FIG. 2 is a cross sectional view taken along a line X—X in FIG. 1.

Referring to FIGS. 1 and 2, a phase shift mask of attenuation type 100 includes a phase shifter portion 10, formed on a transparent substrate 40 made of quartz or the like, for controlling transmittance and phase of the exposure light passing therethrough, and a light transmitting portion 20 for exposing transparent substrate 40.

Phase shifter portion 10 is a single-layered film made of one kind of material selected from the group consisting of chromium oxide, chromium nitride oxide, chromium nitride carbide oxide, oxide of molybdenum silicide, and molybdenum silicide nitride oxide. By using such a film, transmittance of exposure light passing through the phase shifter portion can be made 5–20% and the phase thereof can be converted by 180°.

Four light transmitting portions 20 are arranged in a matrix, and each has a square plane. Near an intersection point of the prolonged diagonal lines of light transmitting portions 20, an auxiliary pattern 30 is provided having an opening of a prescribed size and exposing transparent substrate 40.

With respect to the case where phase shift mask of attenuation type 100 is used, intensity of amplitude and light intensity of exposure light at a cross section taken along a line X—X will be described below.

Figure 3:
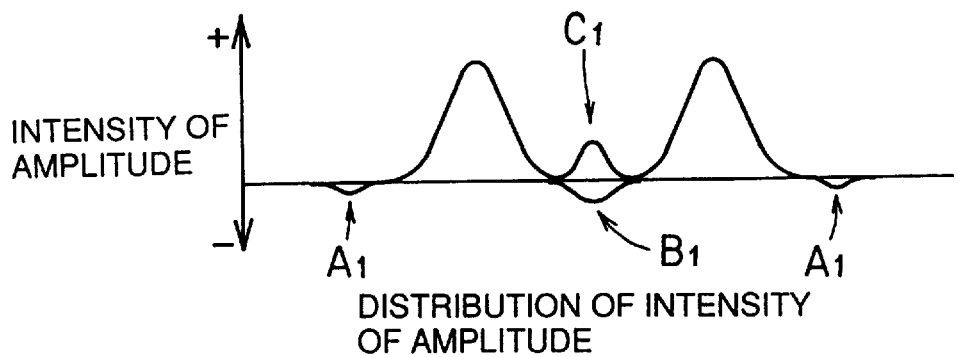
FIGS. 3 and 4 show intensity of amplitude of exposure light taken along the line X—X in FIG. 1.
Figure 37:
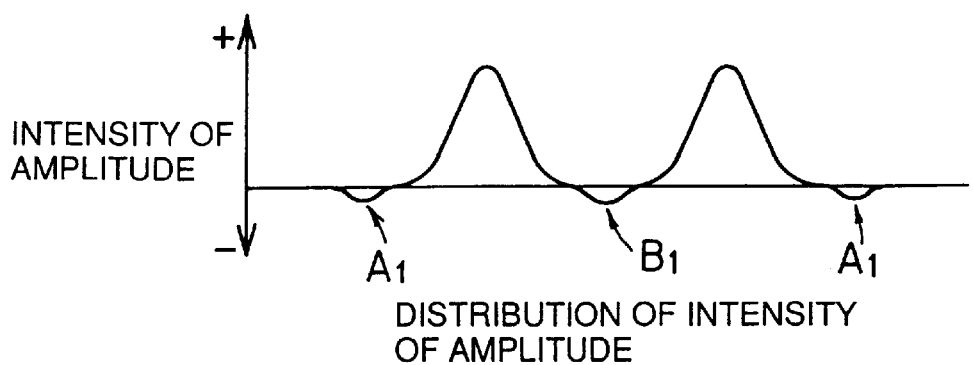
FIGS. 37 and 38 show intensity of amplitude of exposure light taken along a line Y—Y in FIG. 35.
Figure 38:
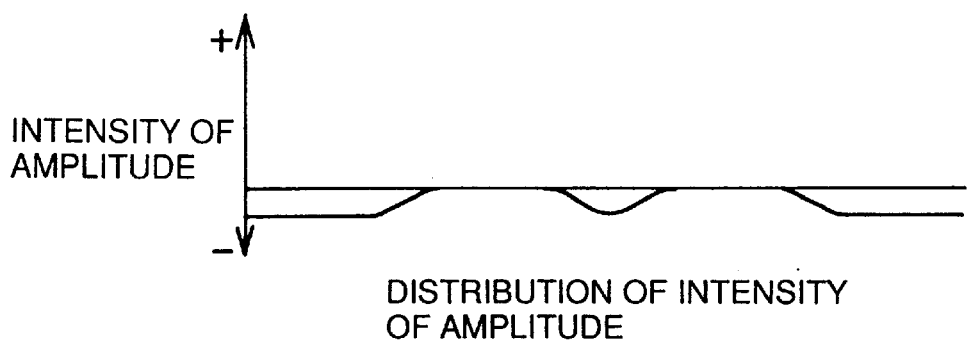

FIG. 3 shows at a cross section taken along the line x—x intensity of amplitude of exposure light transmitting through light transmitting portion 20 and auxiliary pattern 30. In the figure, first-order diffraction light indicated by arrows $A_1$ and $B_1$ is generated similarly to the case shown in FIG. 37. In a region where first-order diffraction light $B_1$ is generated, intensity of amplitude $C_1$ of exposure light transmitting through auxiliary pattern 30 and having a phase different by 180° appears.

Figure 4:
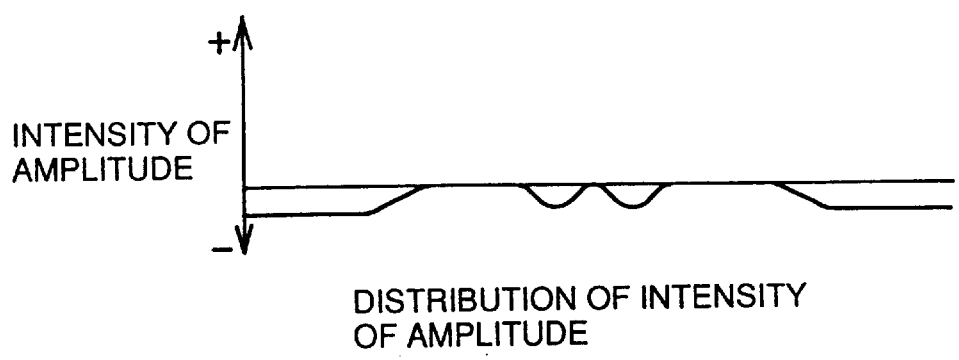
Figure 5:
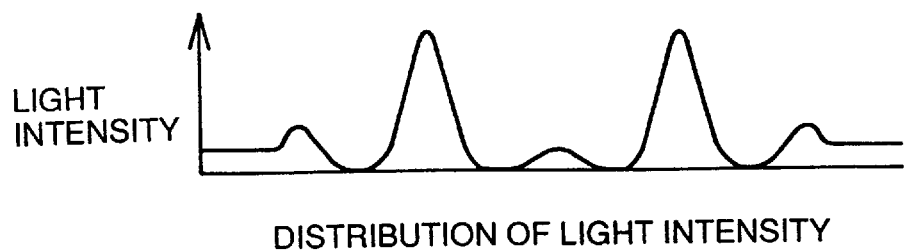
FIG. 5 shows light intensity of exposure light taken along the line X—X in FIG. 1.

FIG. 4 shows intensity of amplitude of exposure light transmitting through phase shifter portion 10 at a cross section taken along the line X—X. FIG. 5 shows light intensity when intensities of amplitude of exposure light shown in FIGS. 3 and 4 are combined.

Figure 39:
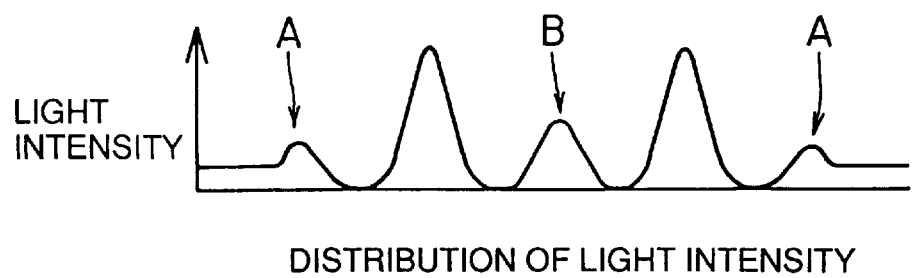
FIG. 39 shows light intensity of exposure light taken along the line Y—Y in FIG. 35.
Figure 40:
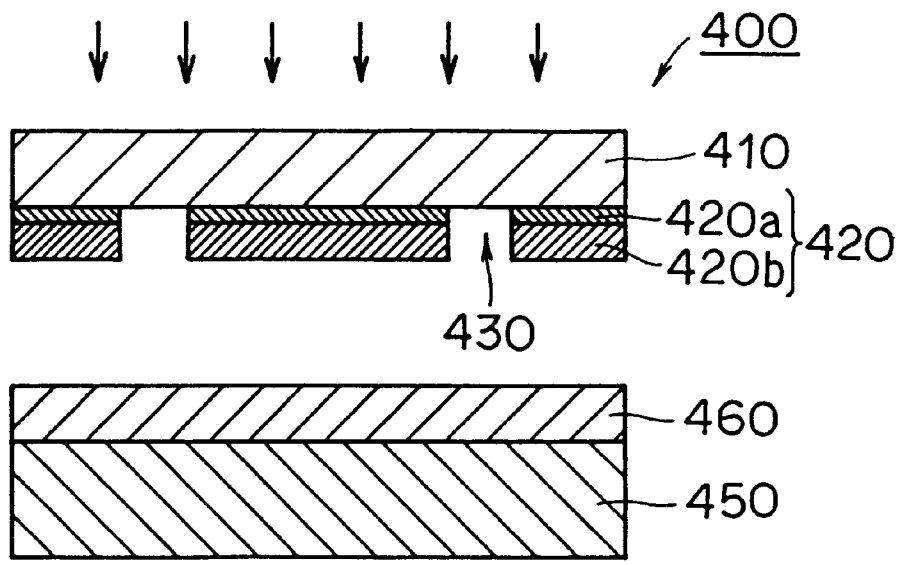
FIGS. 40–42 show exposure steps using a conventional phase shift mask of attenuation type.
Figure 41:
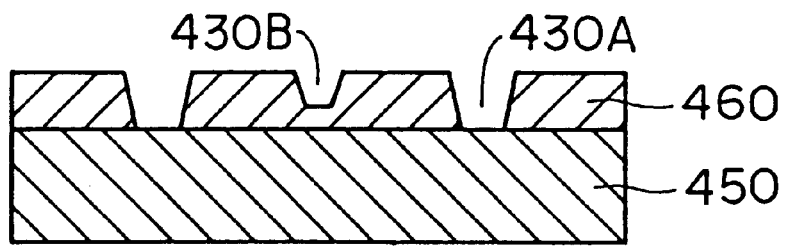
Figure 42:
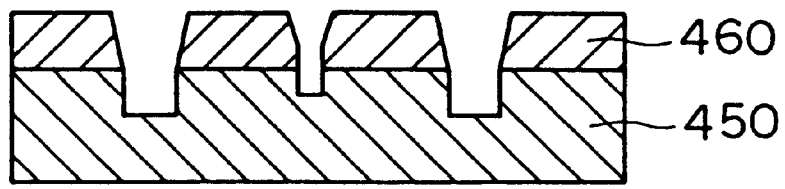
Figure 43:
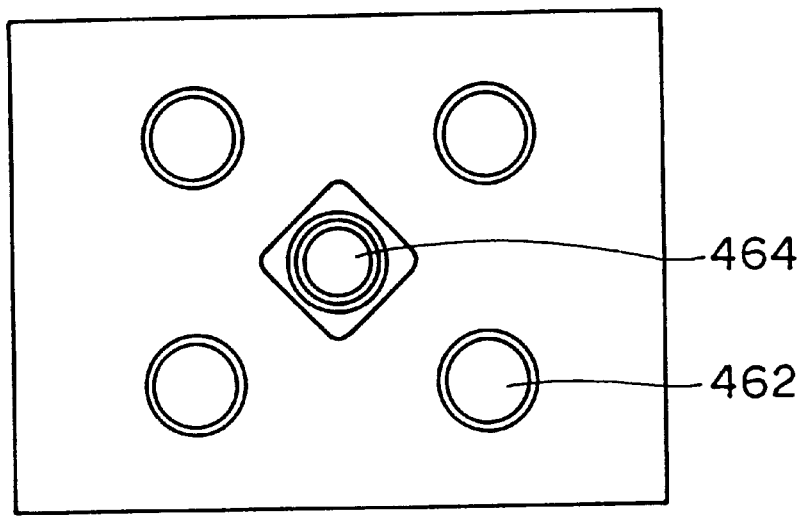
FIG. 43 is a plan view showing a pattern formed by the exposure steps using a conventional phase shift mask of attenuation type.
Figure 44:
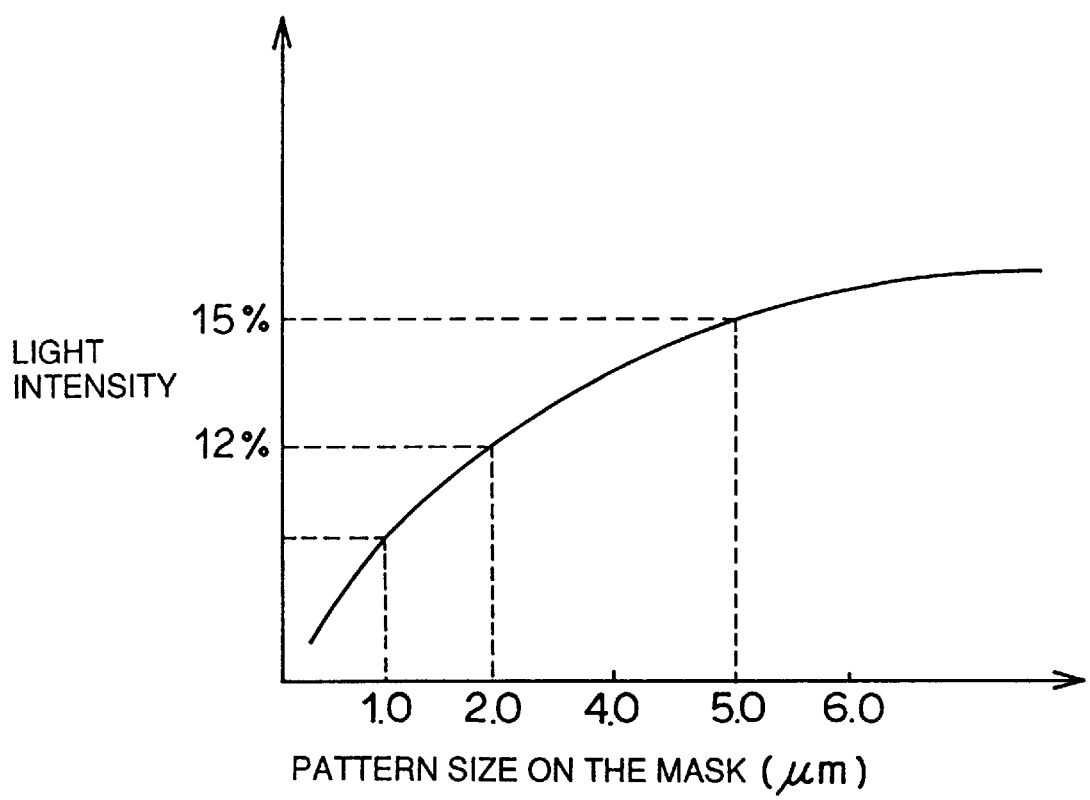
FIG. 44 shows a relation between light intensity and pattern size of a conventional phase shift mask of attenuation type.

As can be seen from the figure, since light intensity $C_1$ of exposure light transmitting through the auxiliary pattern is different in phase by 180° from light intensity $B_1$ of first-order diffraction light as shown in FIG. 3, the light intensities are canceled with each other. Therefore, a so-called side lobe as shown in FIG. 39 of the prior art is not formed in the light intensity shown in FIG. 5.

Next, exposure of a resist film by using phase shift mask of attenuation type 100 forming such exposure light as described above will be described with reference to FIGS. 6–8.

Figure 6:
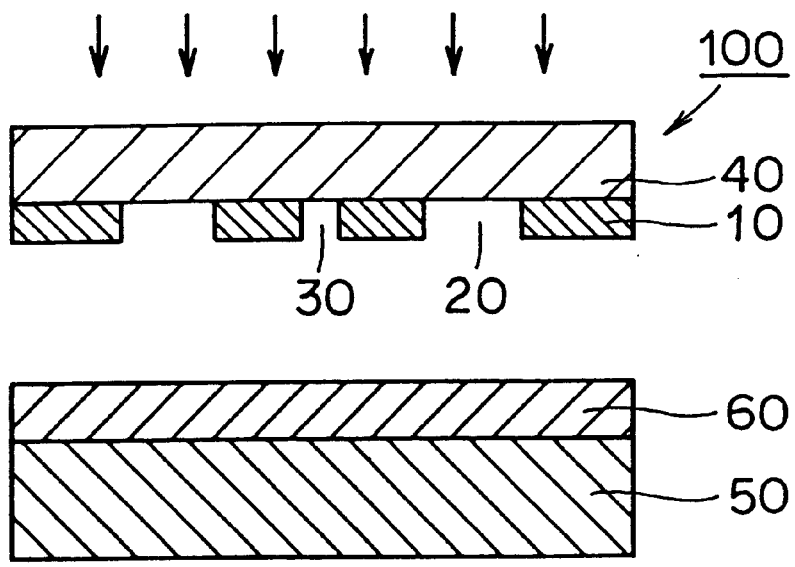
FIGS. 6–8 show exposure steps by using the phase shift mask of attenuation type in accordance with the first embodiment of the present invention.

Referring to FIG. 6, a positive resist film 60 is formed on a semiconductor substrate 50. Positive resist film 60 is exposed to light by using the above-described phase shift mask of attenuation type 100.

Figure 7:
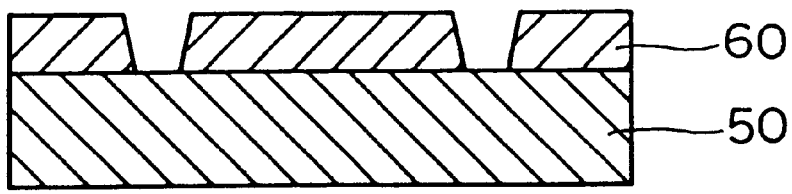
Figure 8:
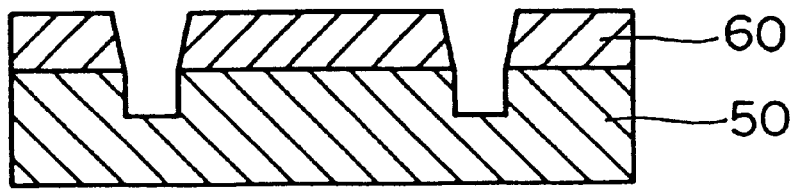

Referring to FIG. 7, positive resist film 60 is developed. At this time, unlike the prior art, there is not such a region corresponding to a side lobe as shown in FIG. 39 which is exposed on resist film 60, and only the region corresponding to the pattern of light transmitting portion 20 is developed. Therefore, by using resist film 60, a pattern of a prescribed shape can be formed at a prescribed region of semiconductor substrate 50 as shown in FIG. 8.

Next, the relation between the sizes of an opening of light transmitting portion 20 and that of auxiliary pattern 30 shown in FIG. 1 will be described below.

In the embodiment shown in FIG. 1, light transmitting portion 20 is 0.45 μm□ and a pitch (P) of light transmitting portion 20 is selected to be 0.9 μm.

Figure 9:
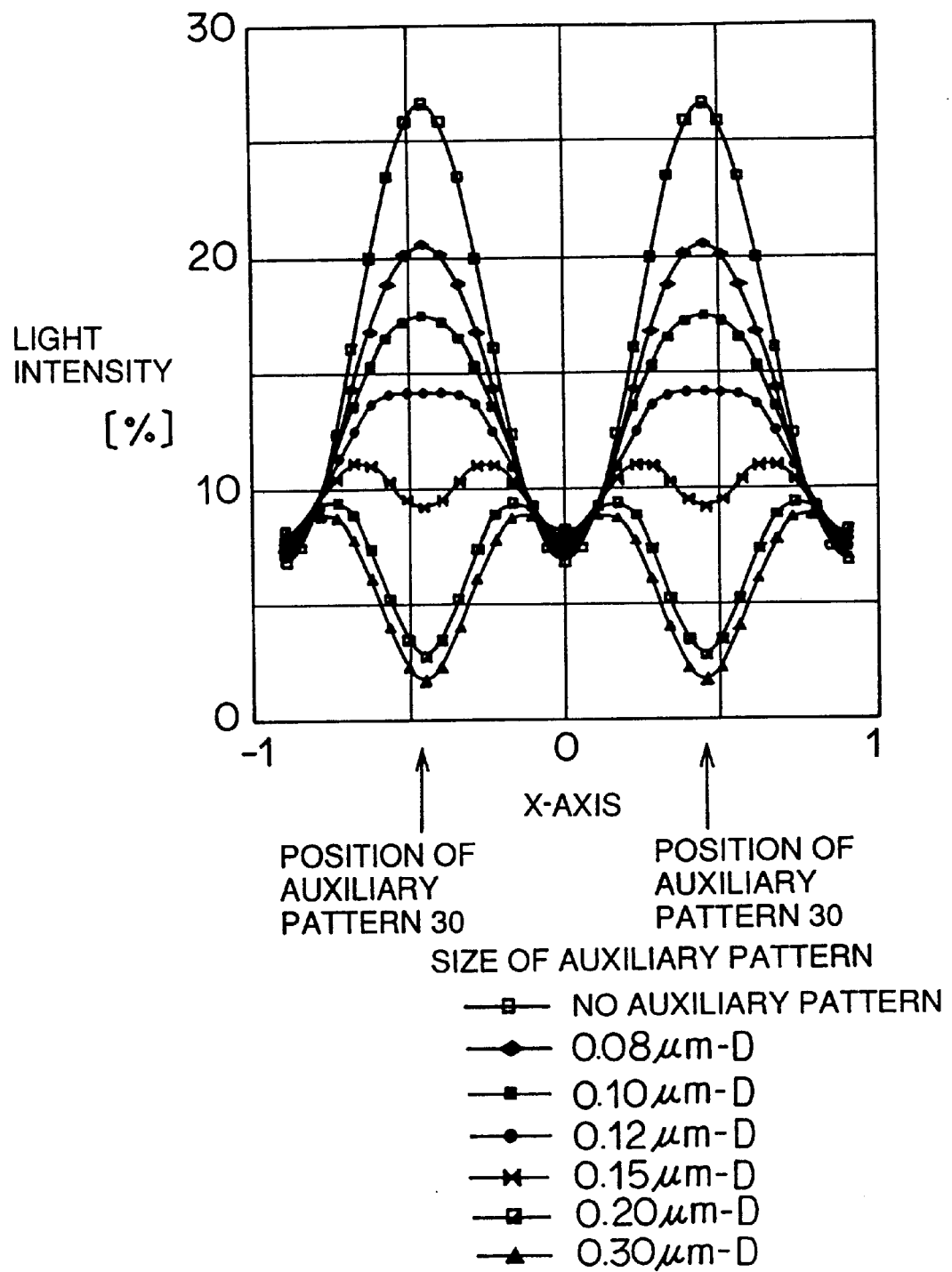
FIG. 9 shows the relation between light intensity and size of an auxiliary pattern.

Referring to FIG. 9, light intensity of phase shift mask of attenuation type 100 at a region of auxiliary pattern 30 will be described with respect to the cases where the auxiliary pattern is 0.08 μm□, 0.10 μm□, 0.12 μm□, 0.15 μm□, 0.20 μm□ and 0.30 μm□. In FIG. 9, the abscissa is based on the X axis shown in FIG. 1 and the ordinate shows light intensity.

As can be seen from the figure, light intensity decreases as auxiliary pattern 30 becomes bigger. It can be said from the figure that light intensity of the phase shift mask of attenuation type at the location of auxiliary pattern 30 can be reduced by providing auxiliary pattern 30 of 0.30 μm.

With this decline in light intensity, however, light intensity at light transmitting portion 20 may also be decreased.

Therefore, auxiliary pattern 30 of 0.15 μm□ is the most preferable, because approximately 10% or less is a satisfactory value for light intensity at a region of auxiliary pattern 30.

The data shown in FIG. 9 is obtained under the conditions where NA is 0.57, σ is 0.4, and the wavelength of exposure light is i-line (365 nm). However, a similar result to that shown in FIG. 9 can be obtained under any conditions by optimizing the size of auxiliary pattern 30 with respect to light transmitting portion 20.

Figure 10:
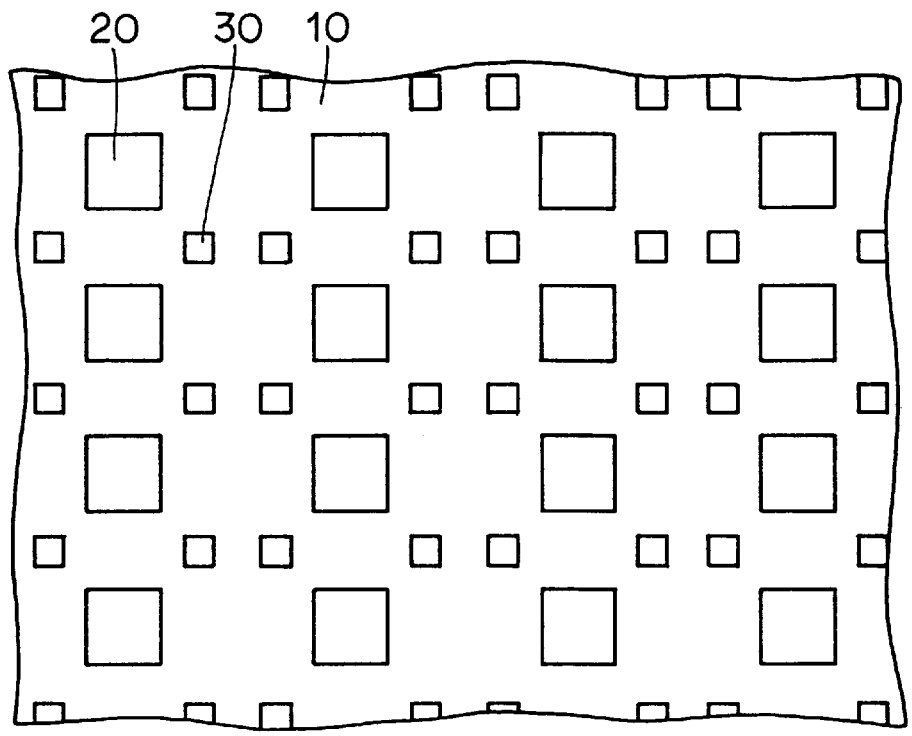
FIGS. 10–12 are plan view showing other patterns of the phase shift mask of attenuation type in accordance with the first embodiment of the present invention.
Figure 11:
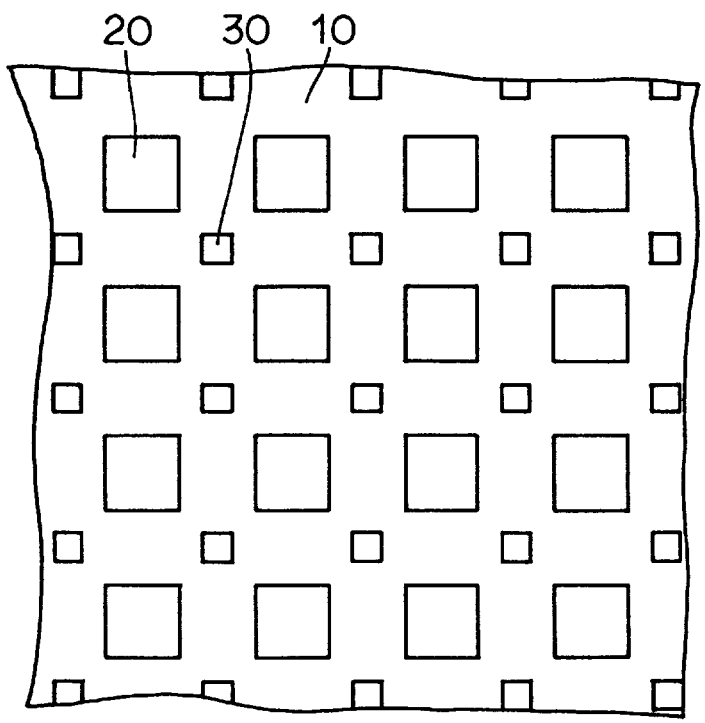
Figure 12:
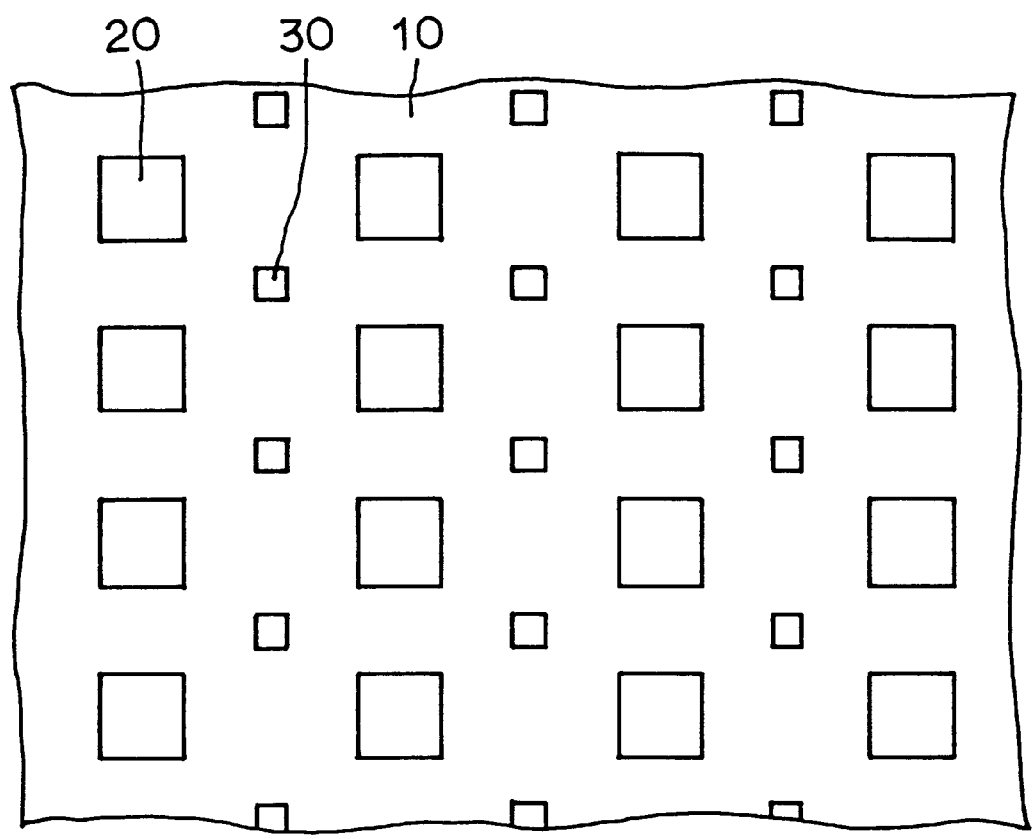

Although FIG. 1 shows a case where only one auxiliary pattern 30 is provided, the present invention is not limited thereto. If a plurality of light transmitting portions 20 are arranged in a matrix, a similar effect can be obtained by arranging auxiliary pattern 30 near an intersection of the prolonged diagonal lines of light transmitting portions as shown in FIGS. 10 and 11. Auxiliary pattern 30 can also be provided at such a location as shown in FIG. 12 depending on the spacing between light transmitting portions 20 shown in FIG. 10.

Figure 13:
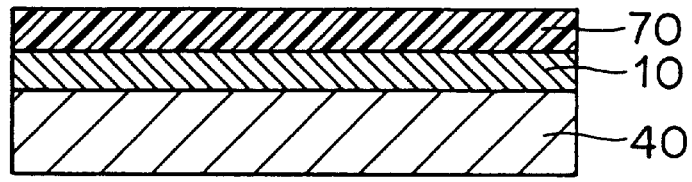
FIGS. 13–16 are cross sectional views showing the steps for manufacturing the phase shift mask of attenuation type in accordance with the first embodiment of the present invention.

Next, a method for manufacturing the phase shift mask of attenuation type shown in FIG. 1 will be described with reference to FIGS. 13–16. Referring to FIG. 13, a phase shift film 10 is deposited to the thickness of 100 nm–300 nm on transparent substrate 40 made of quartz or the like. Phase shift film 10 can be formed as a two-layered film consisting of a chromium film and a silicon oxide film as described with respect to the prior art, or as a single layer film formed of a kind of material selected from the group consisting of chromium oxide, chromium nitride oxide, chromium nitride carbide oxide, oxide of molybdenum silicide, and molybdenum silicide nitride oxide. The phase shift film is required to have an ability of converting phase of transmitting exposure light by 180° and to have 5–20% transmittance of exposure light.

On phase shift film 10, a resist film for an electron beam 70 (ZEP-810S (registered trademark) manufactured by Nippon Zeon Co., Ltd.) or the like is formed to the thickness of approximately 500 nm.

Figure 14:
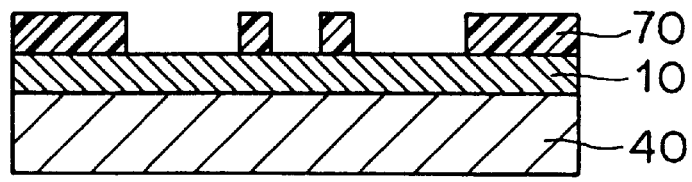

Referring to FIG. 14, an electron beam is directed to expose electron beam resist film 70, which is developed thereafter. At this time, regions of film 70 corresponding to the light transmitting portion and to the auxiliary pattern can be formed easily by directing different amounts of an electron beam thereto inspite of their difference in size. Upon drawing the region corresponding to the auxiliary pattern, the amount of an electron beam may not be sufficient at the periphery of the region due to proximity effect of the beam. In order to avoid such a problem, electron beam exposure data is dimensionally biased (+0.1, +0.3) in advance. As a result, the periphery portion of the region can be drawn to form a pattern just as designed.

Figure 15:
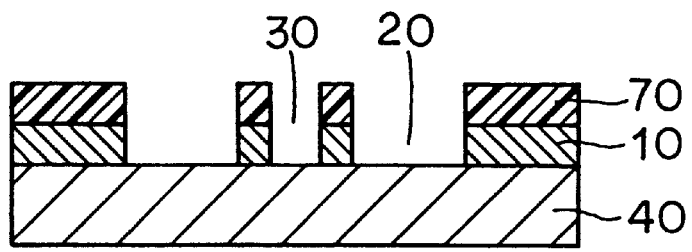

Referring to FIG. 15, phase shift mask 10 is etched by using the developed resist film 70 as a mask. The etching is performed by using a parallel plate RF ion etching apparatus with distance between electrode substrates being 60 mm, reaction gas of $CF_4+O_2$ at a flow rate of 95 sccm and 5 sccm respectively, under an operating pressure of 0.3 Torr for approximately 11 minutes.

Figure 16:
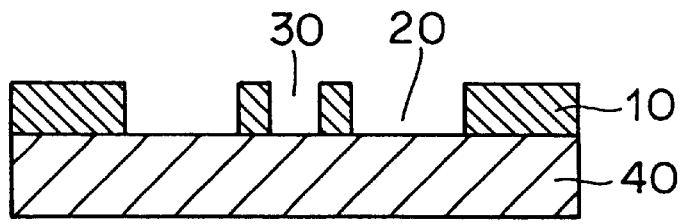

Referring to FIG. 16, phase shift mask of attenuation type 100 can be formed by removing resist film 70.

As described above, in accordance with the first embodiment, light intensity of a side lobe, generated by the combination of light intensity of first-order diffraction light formed by exposure light transmitting through the first light transmitting portion and light intensity of exposure light transmitting through phase shifter portion 10, can be canceled with light intensity of exposure light transmitting through the auxiliary pattern. Therefore, a problem in the prior art, that is, exposure of a resist film by light intensity of a side lobe, can be avoided.

Furthermore, in the present embodiment, the auxiliary pattern is provided near an intersection of the extension of diagonal lines of light transmitting portions. This enables cancellation of light intensity of a side lobe, generated near an intersection of the extension of diagonal lines of light transmitting portions, with light intensity of exposure light transmitting through the auxiliary pattern. Although the auxiliary pattern is shown as a quadrangle, it can also be formed as a circle or a polygon such as a triangle to obtain the similar effect.

Now, a second embodiment of a phase shift mask of attenuation type in accordance with the present invention will be described with reference to the drawings.

Figure 17:
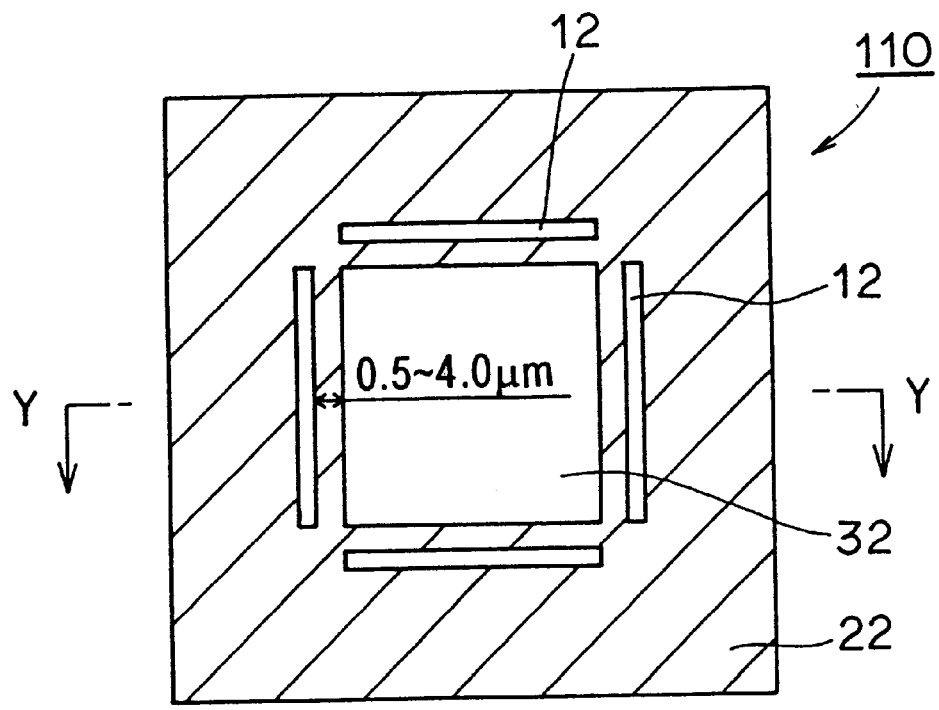
FIG. 17 is a plan view of a phase shift mask of attenuation type in accordance with a second embodiment of the present invention.
Figure 18:
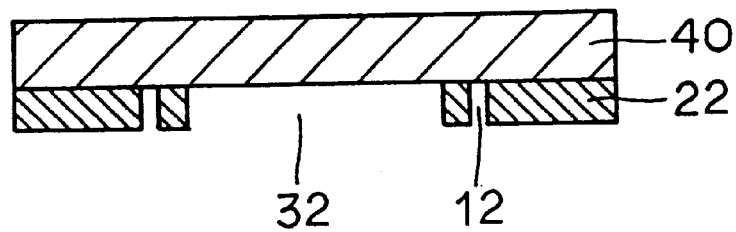
FIG. 18 is a cross sectional view taken along a line Y—Y in FIG. 17.

Referring to FIGS. 17 and 18, a phase shift mask of attenuation type 110 in the second embodiment is a photomask for forming a box-in-box type pattern used for measuring error in alignment. The problem shown in FIGS. 51–54 can be solved by this mask.

Referring to FIGS. 17 and 18, phase shift mask of attenuation type 110 has a phase shift film 22 formed on a transparent substrate 40 formed of quartz or the like. Phase shift mask 22 is formed of the same material as in the first embodiment. The mask also has a light transmitting portion 32 of a square opening of approximately 75 $\mu$m□ for exposing transparent substrate 40. At a prescribed region of phase shift film 22 near the periphery of light transmitting portion 32, an auxiliary pattern 12 having a width of approximately 0.1–0.2 $\mu$m and exposing quartz substrate 40. When i-line (364 nm) is used for exposure, auxiliary pattern 12 should be located at a distance of 0.5–4.0 $\mu$m from the edge of light transmitting portion 32.

Light intensity and amplitude intensity of transmitting exposure light at a cross section taken along a line Y—Y of phase shift mask of attenuation type 110 will be described with reference to FIGS. 19–21.

Figure 19:
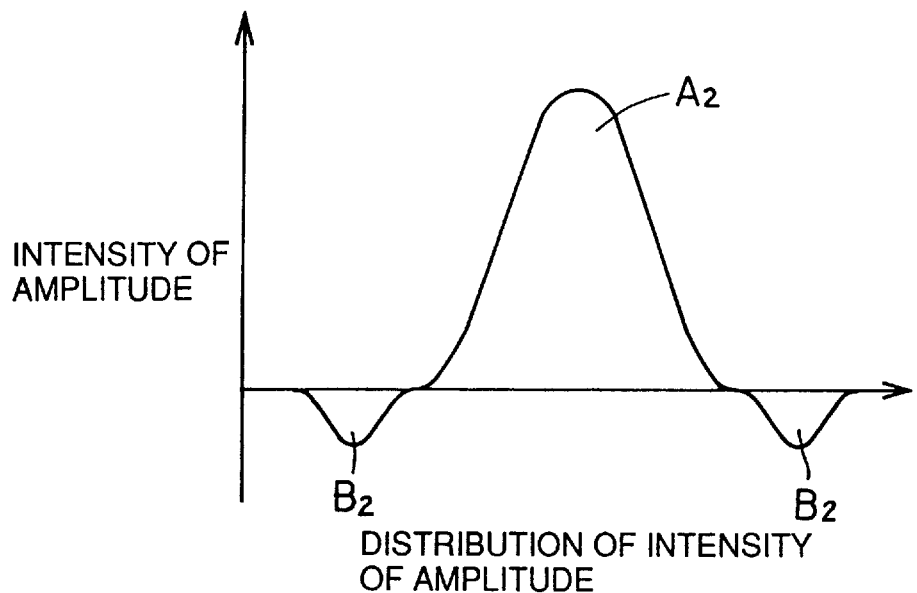
FIGS. 19 and 20 show intensity of amplitude of exposure light taken along the line Y—Y in FIG. 17.

FIG. 19 shows intensity of amplitude of light passing through light transmitting portion 32. A side lobe $B_2$ of first-order diffraction light having a high light intensity is generated at the side of a pattern image $A_2$. FIG. 20 shows amplitude intensities of beams of exposure light passing through phase shifter portion 22 and auxiliary pattern 12 in which $B_5$ indicates intensity of amplitude of exposure light passing through phase shift film 22 and $B_4$ indicates intensity of amplitude of exposure light passing through auxiliary pattern 12.

Figure 20:
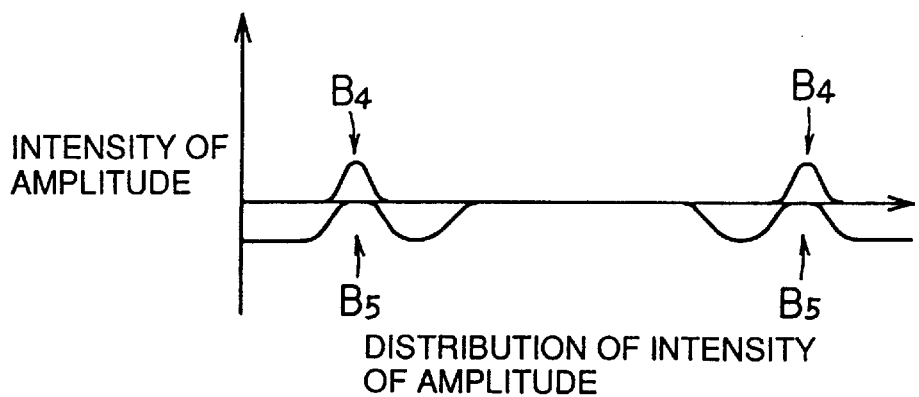
Figure 21:
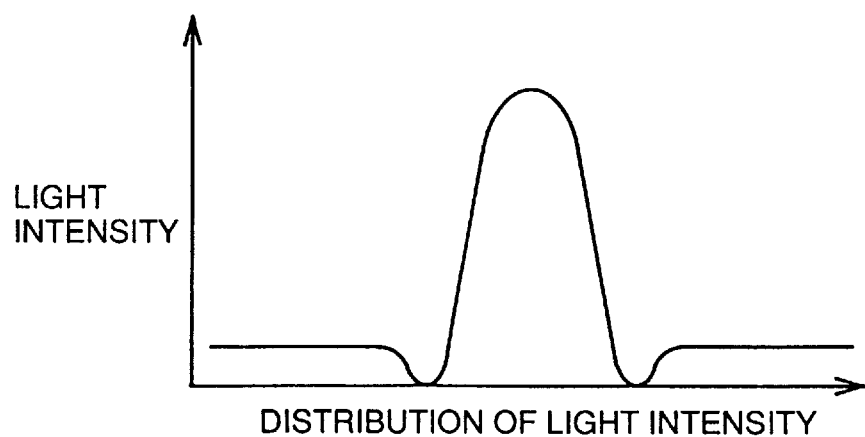
FIG. 21 shows light intensity of exposure light taken along the line Y—Y in FIG. 17.
Figure 50:
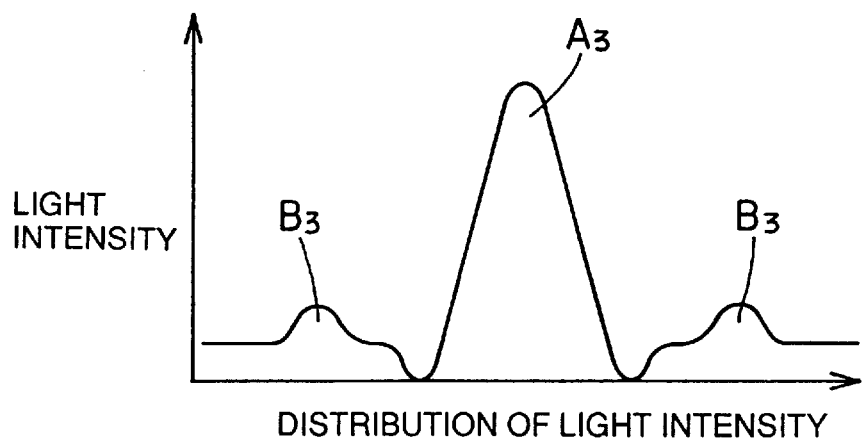
FIG. 50 shows light intensity of exposure light taken along the line S—S in FIG. 47.
Figure 51:
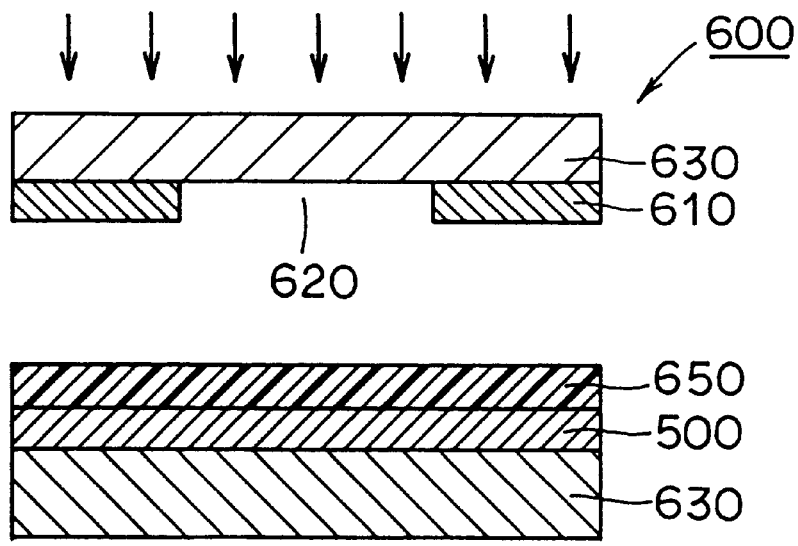
FIGS. 51–53 show exposure steps using a second conventional phase shift mask of attenuation type.

Light intensity, resulting from combination of amplitude intensities of exposure light beams shown in FIGS. 19 and 20, is shown in FIG. 21. Amplitude intensity $B_2$ of the side lobe shown in FIG. 19 can be canceled with the intensity of amplitude $B_4$ of the auxiliary pattern shown in FIG. 20. As a result, light intensity $B_3$ of the side lobe shown in FIG. 50, which has conventionally been a problem, can be reduced.

Figure 45:
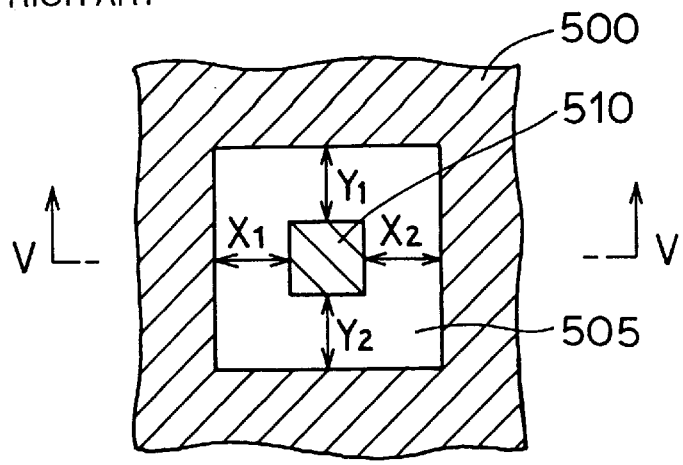
FIG. 45 is a plan view showing a mark pattern for measuring error in alignment in a box-in-box method.
Figure 46:
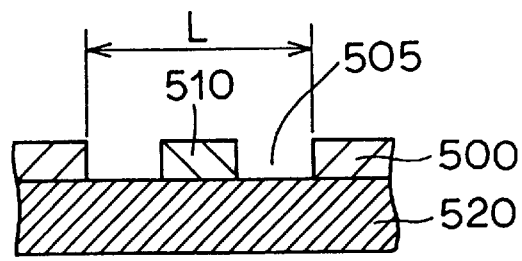
FIG. 46 is a cross sectional view taken along a line V—V in FIG. 45.
Figure 47:
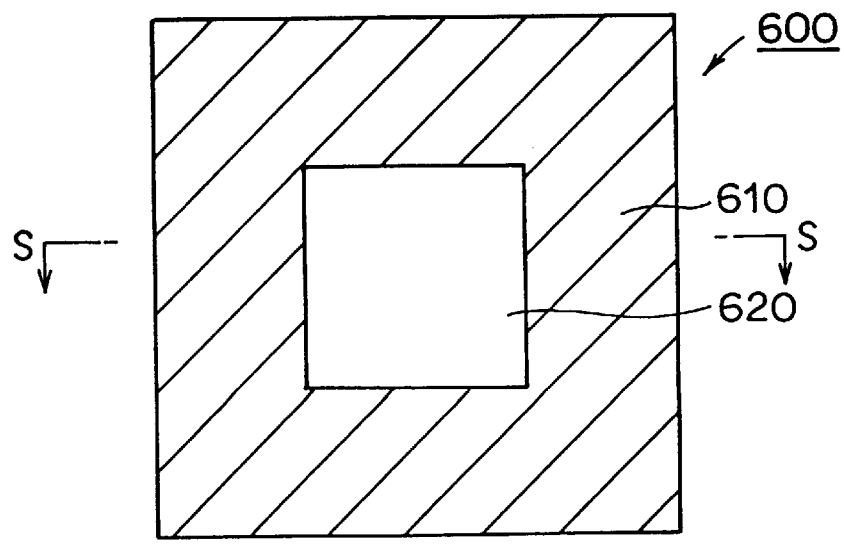
FIG. 47 is a plan view showing a conventional phase shift mask of attenuation type for forming a pattern for measuring error in alignment.
Figure 48:
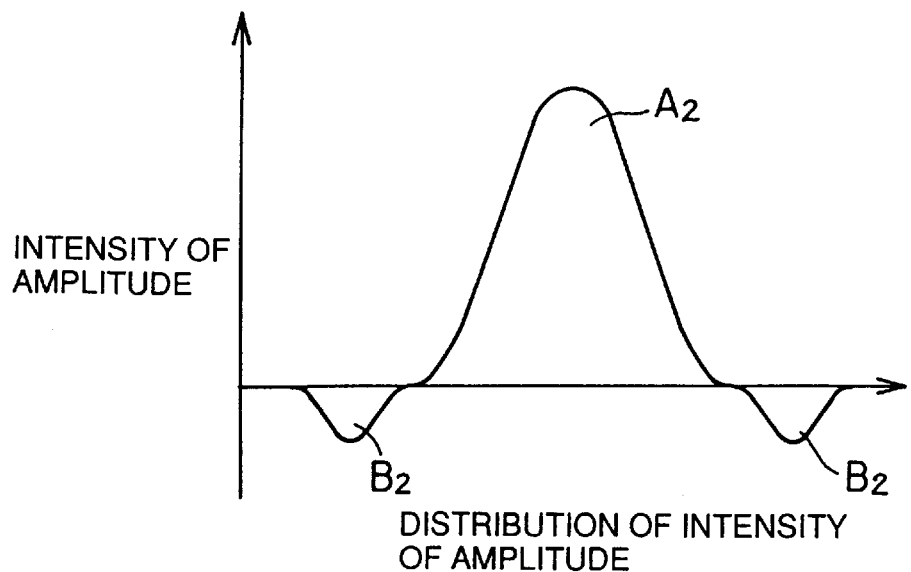
FIGS. 48 and 49 show intensity of amplitude of exposure light taken along a line S—S in FIG. 47.
Figure 49:
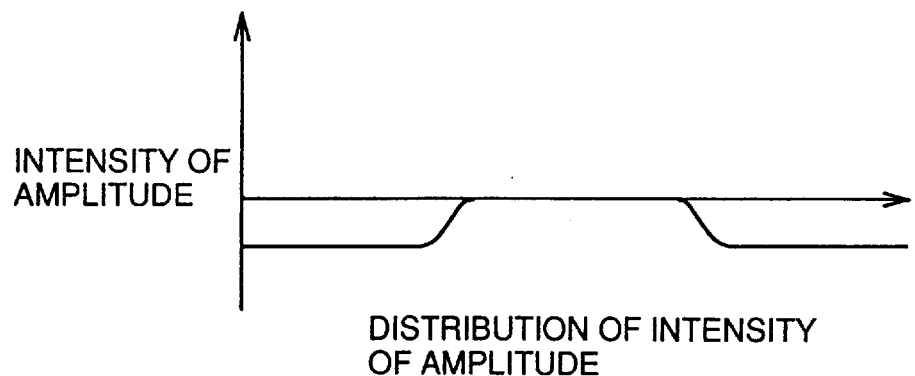

Now, description will be made to formation of opening 505 at first layer 500 shown in FIG. 45 by using phase shift mask of attenuation type 110.

Figure 22:
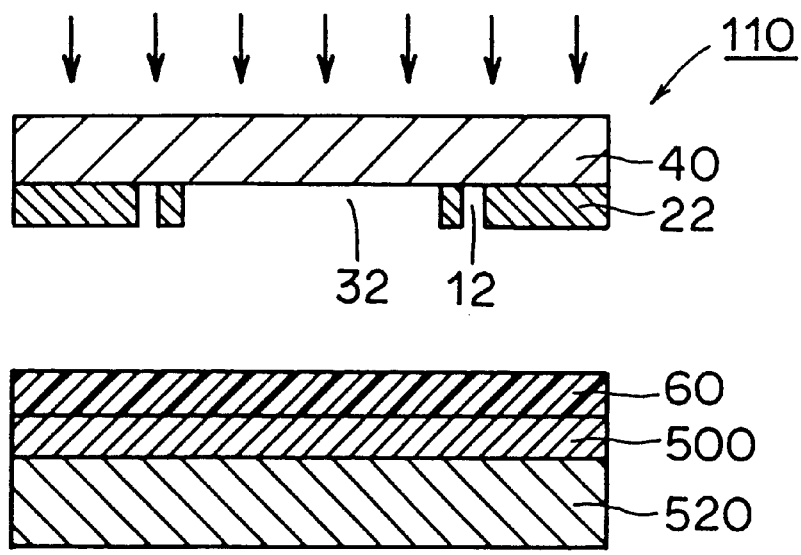
FIGS. 22–24 show exposure steps by using the phase shift mask of attenuation type in accordance with the second embodiment of the present invention.

Referring to FIG. 22, first layer 500 is formed on semiconductor substrate 520, and resist film 60 is formed on first layer 500. Resist film 60 is exposed to light by using phase shift mask of attenuation type 110 in the present embodiment.

Figure 23:
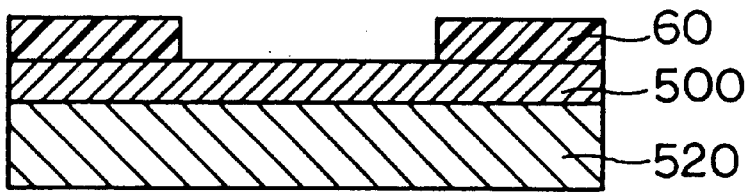
Figure 52:
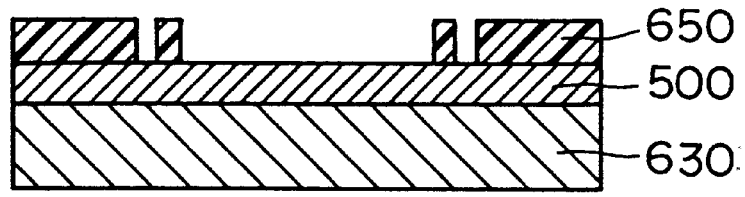
Figure 53:
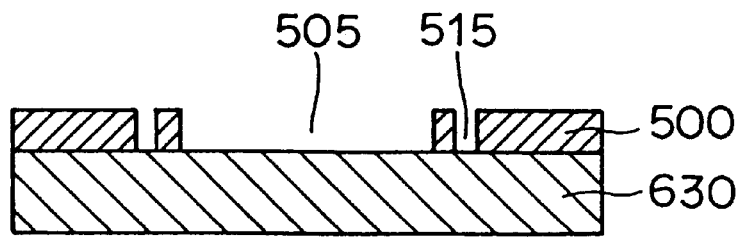
Figure 54:
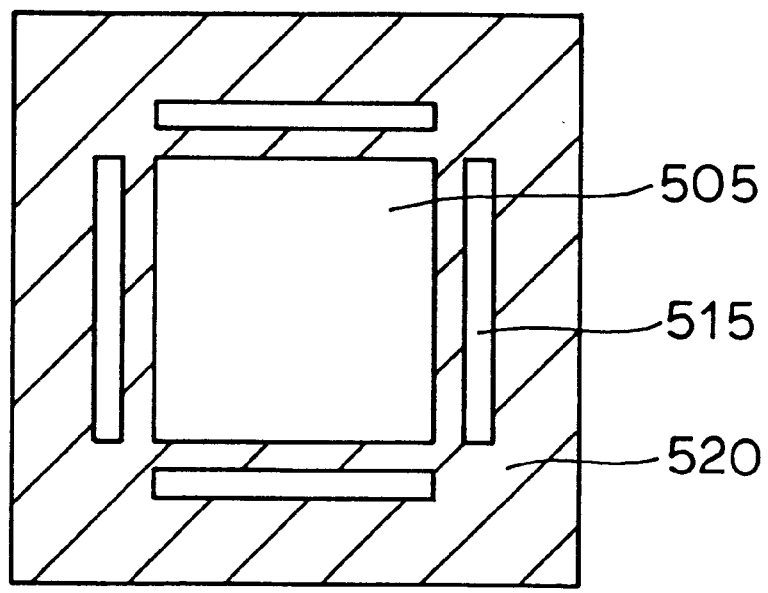
FIG. 54 is a plan view showing a problem associated with a resist pattern formed by using the second conventional phase shift mask of attenuation type.

Referring to FIG. 23, resist film 60 is developed. At this time, only the pattern corresponding to light transmitting portion 32 is exposed to light because, in the present embodiment, light intensity due to generation of the side lobe as shown in FIG. 52 of the prior art does not exist.

Figure 24:
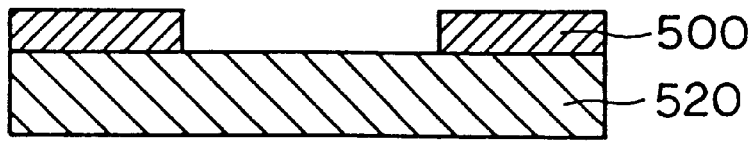

Referring to FIG. 24, first layer 500 is patterned by using resist film 60 as a mask, which is removed thereafter. First layer 500 having opening 505 of a desired shape can thus be formed.

Figure 25:
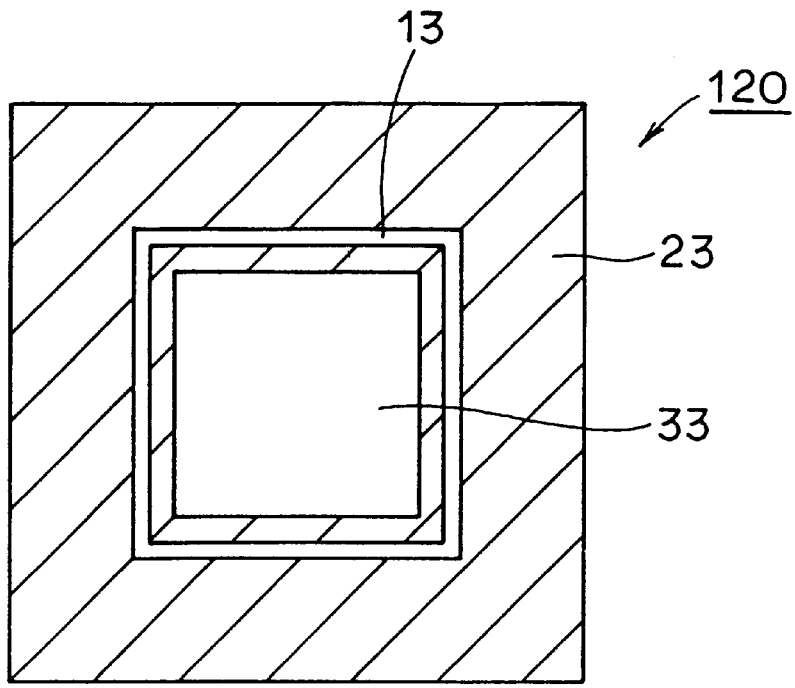
FIGS. 25–29 are plan views showing other patterns of the phase shift mask of attenuation type in accordance with the second embodiment of the present invention.
Figure 26:
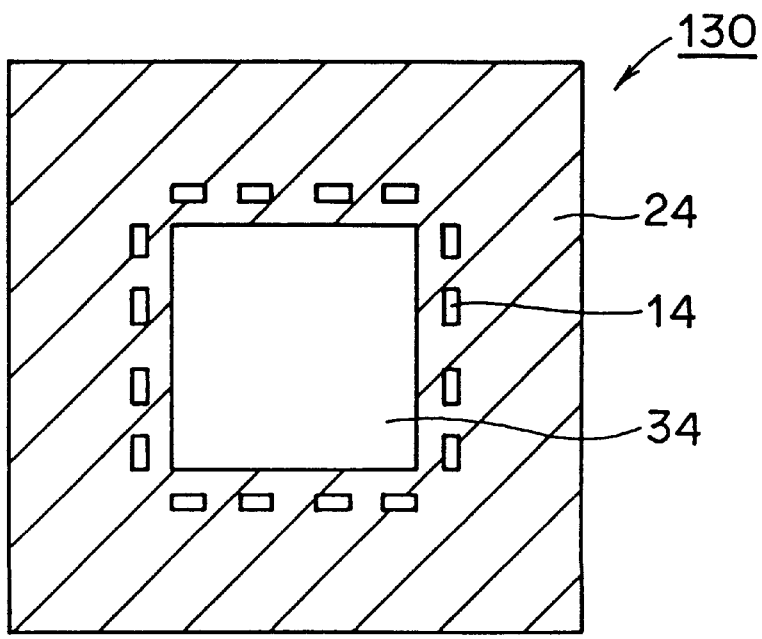

Although phase shift mask of attenuation type 110 shown in FIG. 17 has four auxiliary patterns 12 adjacent to four sides of light transmitting portion 32, other configurations may also be used. For example, a phase shift mask of attenuation type 120 shown in FIG. 25 can also be used in which a frame-shaped auxiliary pattern 13 is provided surrounding a light transmitting portion 33, and a phase shift mask of attenuation type 130 shown in FIG. 26 can also be used in which a plurality of auxiliary patterns 14 are provided at a predetermined distance surrounding a light transmitting portion 34.

Figure 27:
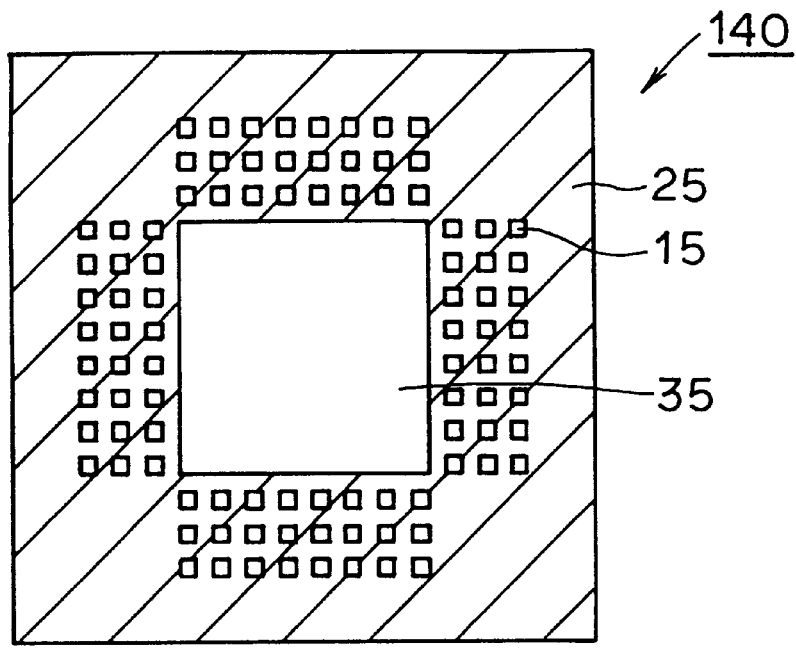
Figure 28:
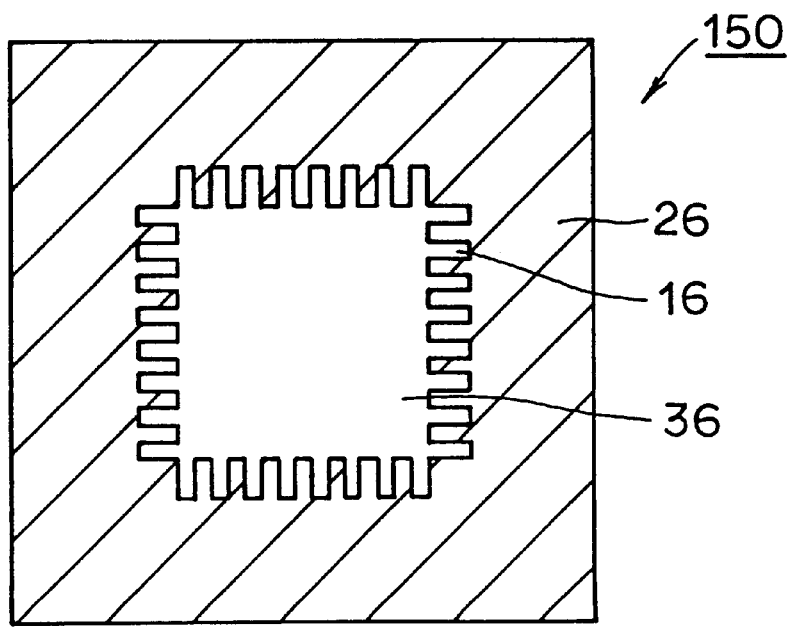
Figure 29:
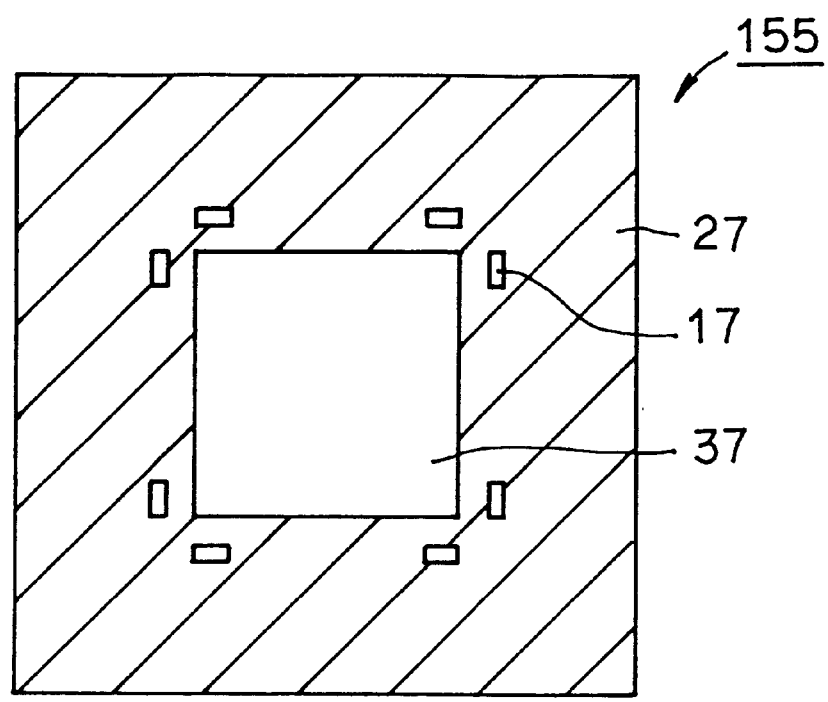

Furthermore, a phase shift mask of attenuation type 140 shown in FIG. 27 can also be used in which a plurality of auxiliary patterns 15 are provided in a matrix surrounding a light transmitting portion 35, and a phase shift mask of attenuation type 150 shown in FIG. 28 can also be used in which a comb-shaped auxiliary pattern 16 is disposed at the edge of a light transmitting portion 36. As shown in FIG. 29, a phase shift mask of attenuation type 155 can also be used in which auxiliary patterns 17 are provided only at a region proximate to the four corners of a light transmitting portion 37. This is because intensity of a side lobe may reach its maximum near the four corners of light transmitting portion 37.

As described above, light intensity of a side lobe generated near a light transmitting portion can be canceled with light intensity of exposure light transmitting through an auxiliary pattern.

Figure 30:
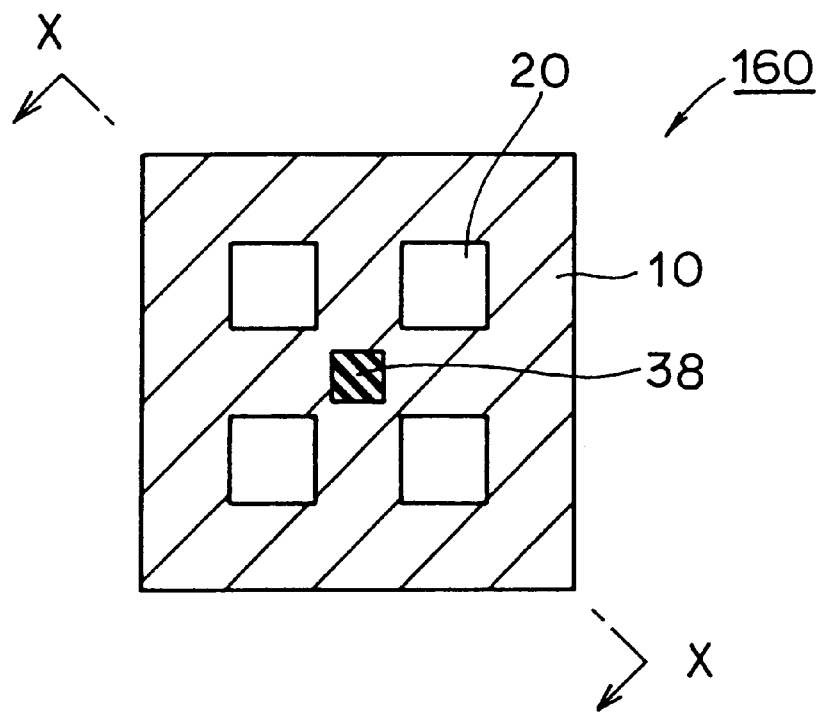
FIG. 30 is a plan view of a phase shift mask of attenuation type in accordance with a third embodiment of the present invention.
Figure 31:
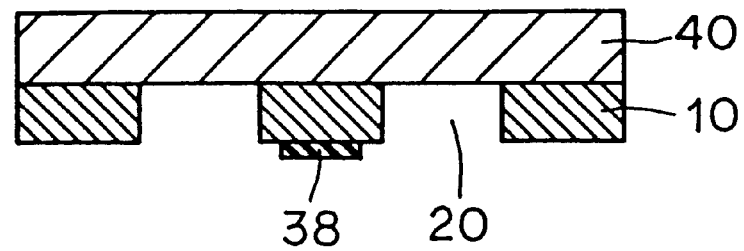
FIG. 31 is a cross sectional view taken along a line X—X in FIG. 30.
Figure 36:
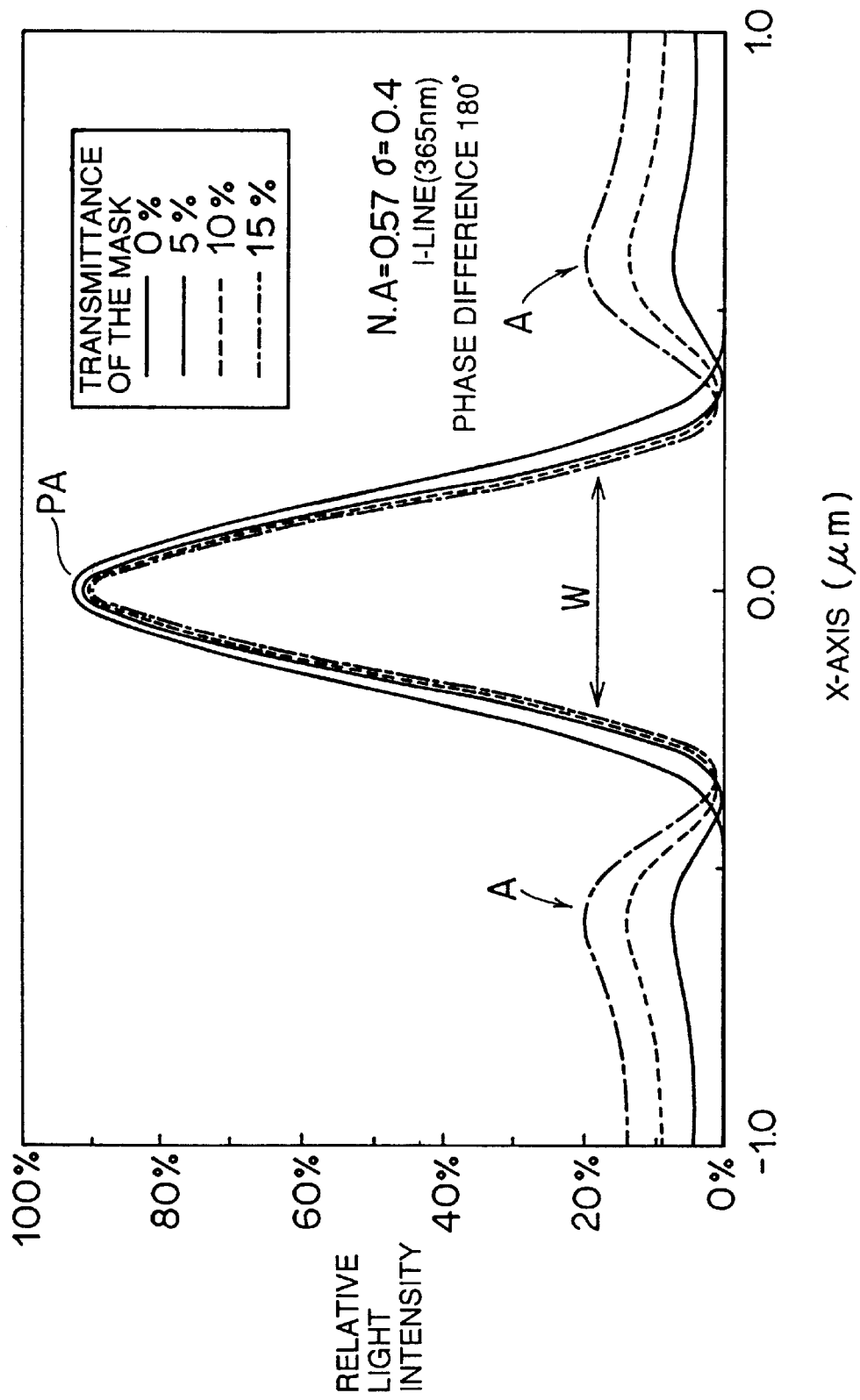
FIG. 36 shows light intensity of exposure light taken along the X axis shown in FIG. 35.

Now, a structure of a phase shift mask of attenuation type in accordance with a third embodiment of the present invention will be described below with reference to FIGS. 30 and 31.

In a phase shift mask of attenuation type 160, in the third embodiment, a light shielding pattern 38 for shielding transmission of exposure light is provided at the position where auxiliary pattern 30 of the attenuation type phase shift mask is provided in the first embodiment. Light intensity of a side lobe can be prevented also by providing beforehand a light shielding film made of carbon or the like at a region where light intensity of the side lobe would be generated, to reduce light intensity at this region.

Also in the phase shift mask of attenuation type in the second embodiment, similar effect can be obtained by replacing the auxiliary pattern with a light shielding pattern at a location where the auxiliary pattern is provided.

As described above, in accordance with the third embodiment, generation of a side lobe can be prevented by forming a light shielding pattern at a region where the side lobe would be generated in order to reduce light intensity at the region.

Although the region of the auxiliary pattern exposes the semiconductor substrate in all the above-described embodiments, similar effect can be obtained with phase shift film being left at the region if transmittance of the auxiliary pattern is 50% or less than that of the light transmitting portion.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A phase shift mask of the attenuation type, comprising:

a first light transmitting portion formed of a semi-transparent film at a prescribed location on a photomask substrate, for controlling transmittance and phase of exposure light passing therethrough;

a second light transmitting portion comprising openings formed in said semi-transparent film and surrounded by said first light transmitting portion for exposing a surface of said photomask substrate; and an auxiliary pattern formed within said first light transmitting portion and comprising a light shielding pattern having an area smaller than the area of said second light transmitting portion, said auxiliary pattern provided at a portion where a side lobe image generated by the exposure light transmitted through the first light transmitting portion is cancelled.

* * * * *

UNITED STATES PATENT AND TRADEMARK OFFICE
CERTIFICATE OF CORRECTION

PATENT NO.   : 6,048,647
DATED        : April 11, 2000
INVENTOR(S)  : Junji MIYAZAKI, et al.

It is certified that error appears in the above-identified patent and that said Letter Patent is hereby corrected as shown below:

In Column 7, Line 60, change "FIG. 32 shows" to --FIGS. 32(a)-32(c) show--.

Line 65, change "FIG. 33 shows" to --FIGS. 33(a)-33(c) show--.

In Column 8, Line 4, change "FIG. 34 shows" to --FIGS. 34(a)-34(c) show--.

Signed and Sealed this

Twenty-seventh Day of March, 2001

Attest:

NICHOLAS P. GODICI

Attesting Officer

Acting Director of the United States Patent and Trademark Office